(12) United States Patent
Yamaguchi et al.

(10) Patent No.: US 7,456,038 B2
(45) Date of Patent: Nov. 25, 2008

(54) THIN FILM TRANSISTOR, INTEGRATED CIRCUIT, LIQUID CRYSTAL DISPLAY, METHOD OF PRODUCING THIN FILM TRANSISTOR, AND METHOD OF EXPOSURE USING ATTENUATED TYPE MASK

(75) Inventors: Hirotaka Yamaguchi, Kawasaki (JP); Masakiyo Matsumura, Kamakura (JP); Yukio Taniguchi, Yokomaha (JP)

(73) Assignee: Kabushiki Kaisha Ekisho Sentan Gijutsu Kaihatsu Center, Totsuka-ku, Yokohama-shi, Kanagawa-ken (JP)

( * ) Notice: Subject to any disclaimer, the term of this patent is extended or adjusted under 35 U.S.C. 154(b) by 159 days.

(21) Appl. No.: 11/397,925

(22) Filed: Apr. 3, 2006

(65) Prior Publication Data
US 2006/0240604 A1    Oct. 26, 2006

(30) Foreign Application Priority Data
Apr. 4, 2005 (JP) ............................. 2005-107183
Apr. 26, 2005 (JP) ............................. 2005-127474

(51) Int. Cl.
*H01L 21/00* (2006.01)
(52) U.S. Cl. .................. 438/30; 438/142; 257/E27.1; 257/E29.117

(58) Field of Classification Search ............... 438/30, 438/142; 437/41
See application file for complete search history.

(56) References Cited

U.S. PATENT DOCUMENTS

| 5,691,115 A * | 11/1997 | Okamoto et al. ............ 430/311 |
| 2004/0234900 A1 | 11/2004 | Schroeder |
| 2006/0170836 A1* | 8/2006 | Kondo et al. ................. 349/43 |

FOREIGN PATENT DOCUMENTS

| CN | 1567068 A | 8/2008 |
| JP | 2003-234285 | 8/2003 |

OTHER PUBLICATIONS

"Ultrafine Machining Technique" issued Feb. 25, 1997, by Ohmsha. Machine translation (furnished by the Chinese Patent Office website) of Reference BB.
Jul. 11, 2008 Office action issued against Chinese Patent Application No. 200610071921.2 which corresponds to U.S. Appl. No. 11/397,925.

* cited by examiner

*Primary Examiner*—Walter Lindsay, Jr.
*Assistant Examiner*—Abdulfattah Mustapha
(74) *Attorney, Agent, or Firm*—Stoel Rives LLP

(57) ABSTRACT

A method of producing a thin film transistor comprises irradiating a resist on a glass base plate with a ray from a light source through a mask and, thereafter, developing the resist to form contact holes, using an i-ray as the ray.

17 Claims, 18 Drawing Sheets

THIN FILM TRANSISTOR, INTEGRATED CIRCUIT, LIQUID CRYSTAL DISPLAY, METHOD OF PRODUCING THIN FILM TRANSISTOR, AND METHOD OF EXPOSURE USING ATTENUATED TYPE MASK

RELATED APPLICATIONS

This application claims priority from Japanese Patent Application No. 2005-107183, filed Apr. 4, 2005, and from Japanese Patent Application No. 2005-127474, filed on Apr. 26, 2005.

TECHNICAL FIELD

The present invention relates to a method of producing a thin film transistor on a glass base plate and a method of exposing a photoresist on the glass base plate by using an attenuated type mask.

BACKGROUND

In a crystalline or polycrystalline thin film transistor (hereinafter called a "TFT") to be formed on a glass base plate for a display panel such as a liquid crystal display panel, miniaturization of a TFT is under study in order to upgrade operation performance.

A glass base plate on which a TFT is formed is remarkably varied in board thickness within its surface in comparison with a semiconductor wafer. There exists such a variation in board thickness of the glass base plate as approximately 9 µm per area of a square with a side of 100 mm (about 9 µm/100 mm□) (due to surface roughness or distribution of board thickness of the base plate itself).

When forming a TFT on such a glass base plate as mentioned above, exposure of a photoresist on the glass base plate requires a depth of focus deeper than exposure for producing a semiconductor device on a semiconductor wafer. In other words, when producing a TFT by miniaturizing, it is necessary to upgrade resolution of an exposure equipment to be used then and also not to shallow the depth of focus. The resolution of the exposure equipment is around 5 µm and 3 µm at present. In this exposure equipment, should the resolution be raised from the above-mentioned value, the depth of focus becomes shallow.

When the resolution becomes high, e.g., over 0.8 µm or so, the depth of focus becomes shallower than approximately 9 µm/100 mm□, which is a variation in glass plate thickness for forming a TFT, so that it becomes impossible to form a desired resist pattern by using the photoresist on the glass base plate. In the case of exposing a photoresist on a glass plate having a great board thickness variation, difference of elevation of the photoresist surface is so great that a deeper focus is required by an optical system of the exposure equipment. An exposure process in production of a TFT includes a formation process of contact holes requiring a deep depth of focus. With the film thickness of the photoresist in this case, usually the depth of focus at the time of exposure becomes shallower than in the case of a line system pattern, and it is necessary to devise not to shallow it.

For instance, the depth of focus for forming contact holes of 0.5 µm□ is ±0.9 µm, which is very shallow. If such contact holes are formed for production of a TFT that is to be formed on a glass base plate by an exposure equipment, an area off the depth of focus is so broad that the photoresist stays on the bottom of the contact holes and prevents opening of through holes, so that there is no contacting a source area and a drain area, for example.

Also, the contact holes of an exposure mask when forming a TFT generally have a square shape. By exposing a photoresist through such a mask, the contact holes for the TFT formed on the photoresist are rounded at their corners to become substantially circular. As a result, according to the above-mentioned exposure method, it is hard to form holes penetrating the photoresist.

In an exposure art, improving a resolution and a depth of focus in an attenuated type mask (to be called an "ATT mask" herein) is described on pages 39-40 of nonpatent document 1.

Also, an art to expose a resist to be used in a machining process of a semiconductor wafer for a semiconductor device and a semiconductor thin film and the like to be formed on a glass base plate for a display panel by using an ATT mask is described in patent document 1.

Nonpatent Document 1

"Ultrafine Machining Technique" issued Feb. 25, 1997, by Ohmsha.

Patent Document 1

Japanese Patent Appln. Public Disclosure No. 2003-234285 Official Gazette.

SUMMARY

The numerical aperture NA of the exposure apparatus described on page 40 of nonpatent document 1 is 0.5, and the coherence factor σ is 0.2. These values are, as described in nonpatent document 1, values for an integrated circuit (LSI).

When forming a TFT on a glass base plate for a display base plate or panel, the area of exposure at each time on a photoresist on the glass base plate is determined in consideration of a throughput. Because the area of exposure is great, the resolution is important, but the depth of focus is regarded as more important. This is because, as mentioned above, the variation of the plate thickness of the glass base plate is much greater than that of an Si wafer for LSI.

In nonpatent document 1, however, there are no concrete values shown about the kind of an exposure optical system, numerical aperture NA, coherence factor σ, and the like for enlarging the depth of focus in exposure when forming a TFT on the glass base plate for the display panel.

In patent document 1, there is a description mainly about the Si wafer for LSI, but not about concrete values of the numerical aperture NA, coherence factor σ, and the like for obtaining a depth of focus necessary for exposure when forming a TFT on the glass base plate for the display panel.

As mentioned above, the kind of the light source for exposure, the coherence factor σ, the kind of exposure optical system to be used, the numerical aperture NA, and the like for obtaining a deeper depth of focus for exposure of a resist formed on a glass base plate for a display panel, particularly to produce contact holes for a crystalline TFT, are not yet known.

An object of several embodiments is to provide a method of producing a TFT in which contact holes perfectly penetrating a resist can be formed.

Another object of several embodiments is to provide a method of exposure using an attenuated type phase shift mask for obtaining a deep depth of focus suitable for exposure to produce a TFT to be formed on a base plate having a great variation in plate thickness, such as a glass base plate for a display panel.

Several method embodiments of producing a TFT comprise steps of irradiating a photosensitive material film, that is, a photoresist on an incomplete TFT formed on a glass base plate through a mask with a ray from the light source and forming contact holes in the photoresist. As the ray, an i-ray is used.

In a first embodiment of a method of production, the mask has a contact hole pattern including either one of plural rectangular (including oval and elliptic) light transmitting areas and light screening areas for the TFT formed on the glass base plate, and either one of the light transmitting areas and the light screening areas have a shape in which the length dimension in the direction of the long sides is at least 1.4 times as long as the length dimension in the direction of the short sides.

In the second embodiment of a method of production, the mask is a screening-type chrome mask and has a contact hole pattern including either one of plural rectangular (including oval and elliptic) light transmitting areas and light screening areas for the TFT formed on the glass base plate. The optical system is a projection optical system of equal magnification having the numerical aperture NA to be obtained by the following formula (1) when k1 is a factor having a value between 0.40 and 0.43, and R is the length dimension in the direction of the short sides of the rectangle:

$$NA2 = k1 \times 0.365/R \qquad (1)$$

In the third embodiment of a method of production, the mask is an ATT mask and has either one of plural rectangular (including oval and elliptic) light transmitting areas and light screening areas for the TFT formed on the glass base plate. The optical system is a projection optical system of equal magnification having the numerical aperture NA to be obtained by the above formula (1) when k1 is a factor having a value between 0.38 and 0.48, and R is the length dimension in the direction of the short sides of the rectangle.

In the first embodiment of a method of production, the contact holes formed on the photosensitive material film, that is, the photo resist, may have a rectangular planar shape with at least each corner portion arc-shaped.

In a second embodiment of a method of production, the contact hole pattern is a periodical pattern in which a pitch in the direction of the long sides of the rectangle is the same as or more than the sum of the length of a long side and the length of a short side, and may be disposed in either one of the light transmitting areas and the light screening areas.

In a third embodiment of a method of production, the contact hole pattern is a periodical pattern in which a pitch in the direction of the long sides of the rectangle is the same as or more than the sum of the length of a long side and the length of a short side, and may be disposed in either one of the light transmitting areas and the light screening areas.

All of these first to third embodiments of methods of production can further comprise processing the resist to form contact holes in the resist.

The contact holes to be formed in the resist of a photosensitive material film may have a rectangular planar shape with at least each corner portion being arc-shaped.

The contact holes to be formed in the resist can have a rectangular planar shape of which the length dimension in the direction of the long sides is at least 1.4 times as long as the length dimension in the direction of the short sides.

All of the first to third method embodiments of exposure comprise steps of making a ray from the source for exposure enter an optical system through an ATT mask and irradiating the ray having passed through the optical system on a resist layer made of a photosensitive material on the glass base plate, using an i-ray as the ray, and using a projection optical system of equal magnification having the numerical aperture NA to be obtained by the previous formula (1) as the optical system.

In the first method of exposure according to the present invention, the ATT mask has a line pattern to be formed on the resist layer. Also, in the equation (1), R is the width of lines to be formed on the resist line.

In the second embodiment of a method of exposure, the ATT mask has a contact hole pattern to be formed on the resist layer on the glass base plate. Also, in the equation (1), k1 is a factor having a value between 0.48 and 0.5, and R is the bore diameter (or the long diameter) of the holes to be formed in the resist layer.

In the third embodiment of a method of exposure, the ATT mask has a contact hole pattern to be formed on the resist layer on the glass base plate and has a contact hole arrangement pitch at least four times as long as the pitch of the contact holes. Also, in the equation (1), k1 is a factor having a value between 0.48 and 0.5, and R is the bore diameter of the holes to be formed in the resist layer.

According to the first through third embodiments of methods of production, even when the photosensitive material film is formed on a base plate with a great variation in plate thickness, a depth of focus workable in the exposure process can be obtained, and fine contact holes that can perfectly penetrate the photosensitive material film can be formed.

Also, according to the first through third embodiments of methods of exposure, it is possible to obtain a method of exposure using an ATT phase shift mask capable of obtaining a deep depth of focus suitable for exposure of a resist layer for producing a TFT to be formed on a base plate with a great variation in plate thickness, such as the glass base plate for a display panel.

Additional aspects and advantages will be apparent from the following detailed description of preferred embodiments, which proceeds with reference to the accompanying drawings.

BRIEF DESCRIPTION OF THE DRAWINGS

FIGS. 2A and 2B are views showing one embodiment of an ATT mask to be used in an exposure process for explaining embodiments of an exemplary production method, of which FIG. 2A is a plan view of the ATT mask, and FIG. 2B is a section of the ATT mask obtained along the line 2B-2B in FIG. 2A.

FIG. 10A is a plan view of the ATT mask, and FIG. 10B is a section of a processed base plate for explaining a state exposed through the mask pattern, obtained along the line 10B-10B in FIG. 10A.

FIG. 11A is a plan view of the ATT mask, and FIG. 11B is a section of a processed base plate for explaining a state exposed through the mask pattern, obtained along the line 11B-11B in FIG. 11A.

DETAILED DESCRIPTION OF EMBODIMENTS

In the present invention, "rectangle" includes oval and elliptic shapes. "Contact holes" means holes provided in an insulating layer for linearly embedding conductors to electrically connect between conductor layers provided on the surface and underside of the insulating layer, between the conductor and a source area, between the conductor and drain areas, and between gate electrodes. In this specification, holes to be provided in a photosensitive material film for forming these holes by etching are also defined as contact holes.

Below are explained, firstly, an exposure equipment to be used for both methods of producing a TFT and of exposure and, then, an exemplary method of producing a TFT.

Figure 1:
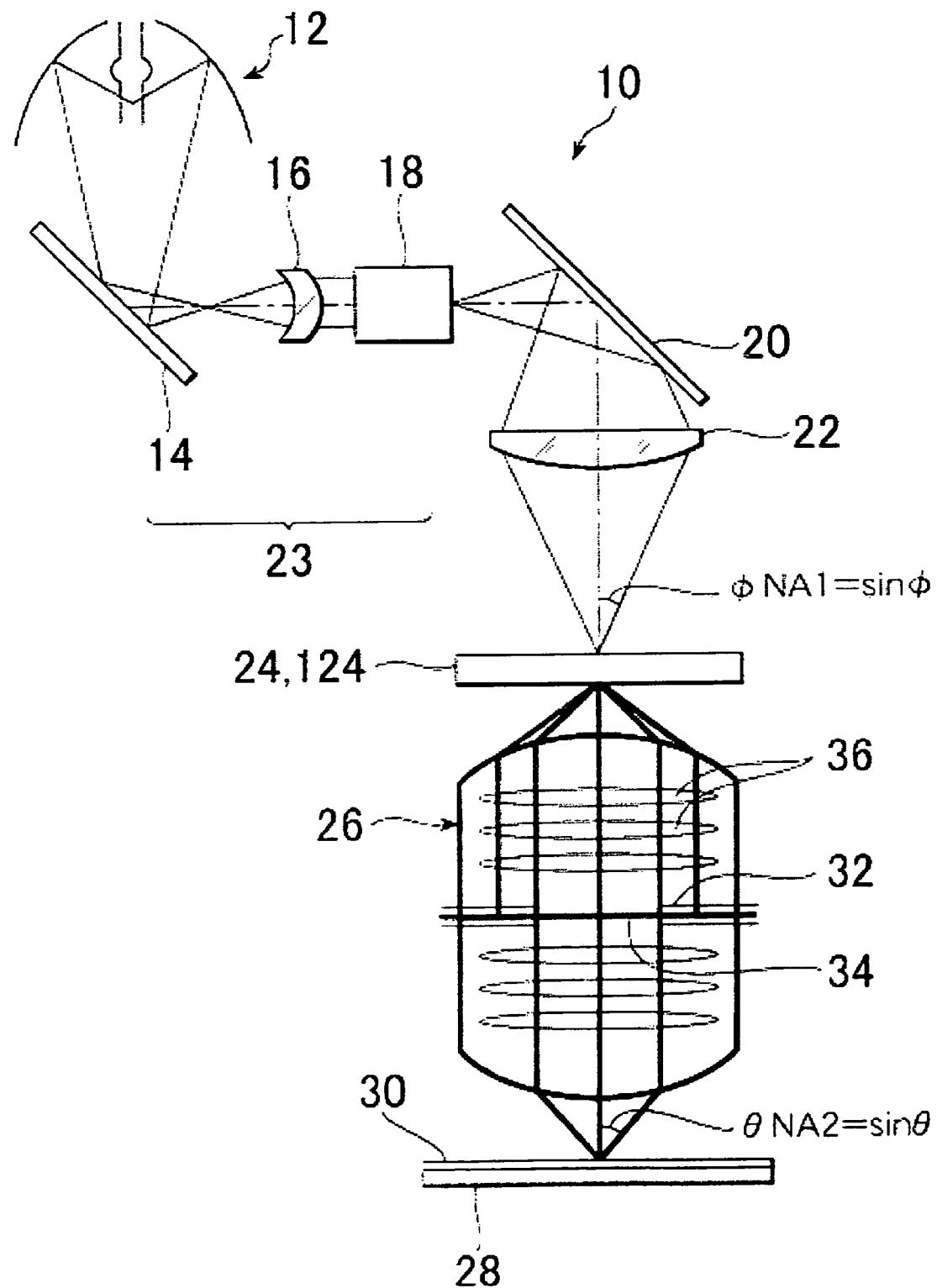
FIG. 1 is a block diagram showing one embodiment of exposure equipment suitable for carrying out the production method and the exposure method according to the present invention.

Referring to FIG. 1, an exposure equipment 10 comprises, besides a light source 12 for exposure, a reflector 14 disposed in an optical path from the light source 12 for reflecting an outgoing ray from the light source 12, two kinds of intermediate lenses 16 and 18 for focusing the ray reflected from the reflector 14, a reflector 20 for reflecting the ray from the intermediate lens 18 so that it may be directed to an ATT mask 24, a focusing lens 22 for irradiating the ATT mask 24 by focusing the ray reflected by the reflector 20, and a projection optical system 25 for irradiating a photosensitive material layer, such as a resist film 30, formed on a processed base plate such as a glass base plate 28 with the ray having passed the ATT mask 24.

An exemplary light source 12 is a mercury lamp which generates an i-ray having a wavelength of, e.g., 365 nm.

The reflector 14, the intermediate lenses 16 and 18, the reflector 20, and the focusing lens 22 are common optical members and form an illumination optical system 23. The ray from the light source 12 is focused by the illumination optical system 23 to enter the ATT mask 24. The ATT mask 24 is a mask whose light screening area has a 6% to 8% transmittance.

The glass base plate 28 is one used for production of a display panel such as a liquid crystal display panel, and in the semiconductor thin film to be provided on the glass base plate, a TFT for driving the display panel is formed as mentioned later.

A projection optical system 26 is a projection optical system of equal magnification for projecting an image of the mask 24 on the resist film 30 at equal magnification, and in the illustration, has an NA diaphragm 32, a pupil plane 34, a plurality of lenses 36, and the like. The ray having passed the ATT mask 24 enters the resist film 30 at equal magnification through the projection optical system 26.

The resist film 30 is made of a photoresist material, for example, a chemical amplitude type photoresist material for i-ray. For instance, the photoresist material is applied to the surface of the glass base plate 28 by an appropriate technique such as spin coating, and is thereafter dried to form the resist film 30.

The numerical aperture of the illumination optical system 23 including the focusing lens 22, eventually NA1, which is the numerical aperture of the light incident on the ATT mask 24 from the focusing lens 22, can be obtained from the following formula (2) when an open angle of the incident light is $2\phi$.

$$NA1 = \sin\phi \quad (2)$$

Likewise, the numerical aperture in the projection optical system 26, eventually NA2, which is the numerical aperture for the light irradiating the resist film 30 from the projection optical system 26 can be obtained from the following formula (3) when the open angle of the incident light is $2\theta$.

$$NA2 = \sin\theta \quad (3)$$

Figure 2A:
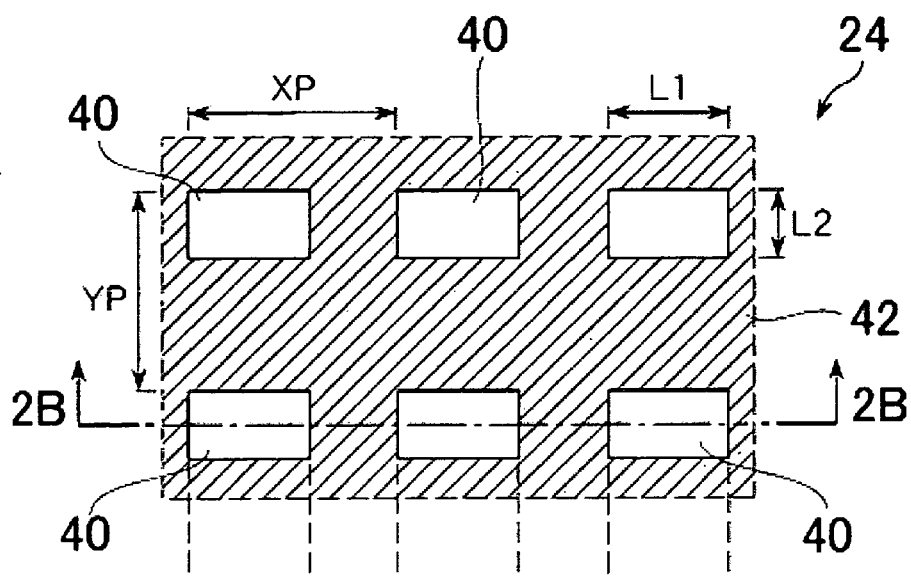
Figure 2B:
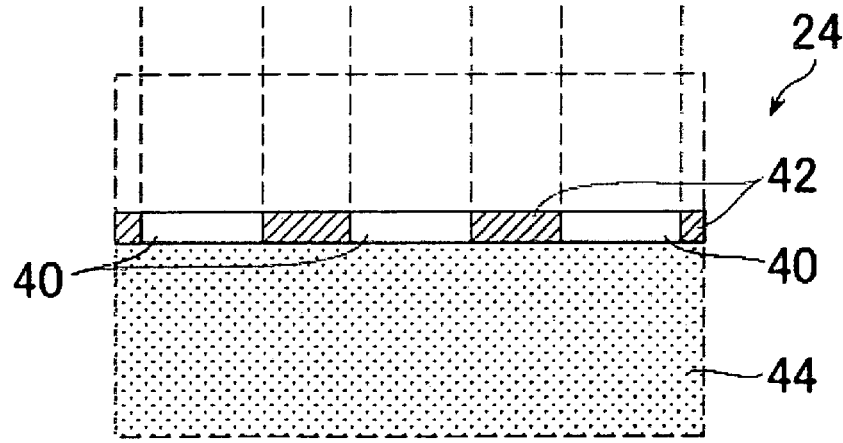

The ATT mask 24, as shown in FIGS. 2A and 2B, includes a plurality of, for example, light permeable areas 40 having a rectangular planar shape and, for example, semi-permeable areas 42 different from the areas 40 in light passing characteristic. Because of the existence of the areas 40 within the areas 42, the ATT mask 24 has the contact hole pattern of the areas 40 formed like a matrix on one of the faces of a light-permeable base plate, e.g., a glass base plate 44 for mask.

In the ATT mask 24 shown in FIGS. 2A and 2B, when the photosensitivity characteristic of the resist film 30 is positive, the areas 40 form semi-transparent light transmitting areas having a certain transmittance; however, if the photosensitivity of the resist film 30 is negative, the areas 40 form resist film screening areas, and the areas 42 form light transmitting areas.

In place of the ATT mask 24, a chrome mask, which is an ordinary light screening mask having a contact hole pattern such as mentioned above, can be used, and either the chrome mask or an ATT phase shift mask 24 will do.

In case the ATT mask 24 is the latter ATT mask, either of the following is usable: (A) a mask including light screening areas having 6% to 8% transmittance and light transmitting areas shifting the phase of the light by 180° and having substantially 100% transmittance, or (B) a mask including light screening areas having 6% to 8% transmittance and shifting the phase of the light by 180° and light transmitting areas having substantially 100% transmittance.

Materials of the light screening areas 42 vary depending on which type of the above-mentioned masks is used, but any publicly known materials, such as MoSiO, MoSiON, and Cr, on the market can be used. Whichever ATT mask 24 (either (A) or (B)) mentioned above is used, the mask 24 having such a contact hole pattern is produced before exposing the resist film 30.

Figure 8:
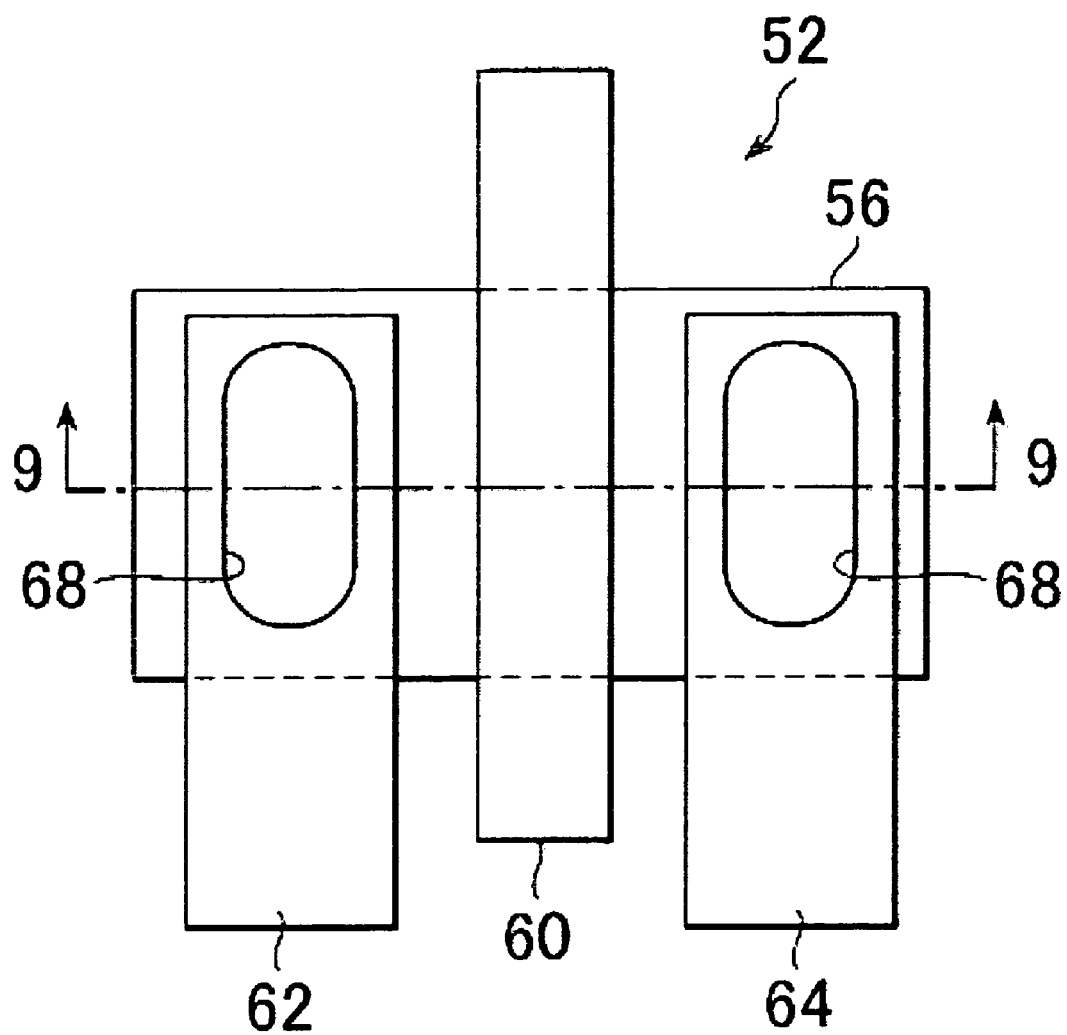
FIG. 8 is a plan view of a TFT to be produced through an exposure process using the exposure apparatus in FIG. 1.
Figure 9:
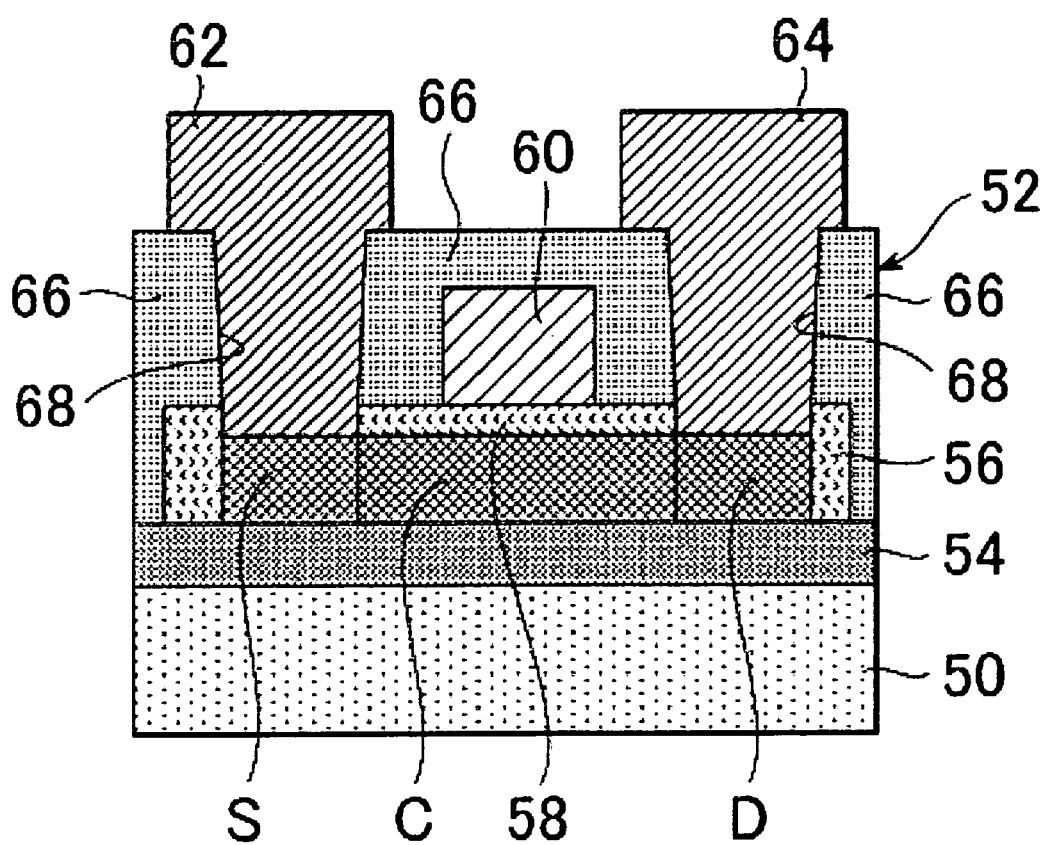
FIG. 9 is a section obtained along the line 9-9 in FIG. 8.

FIGS. 8 and 9 show one embodiment of a TFT 52 made of a crystalline or polycrystalline semiconductor formed on a glass base plate 50 for a display panel such as a liquid crystal display panel.

Referring to FIGS. 8 and 9, on one face of the glass base plate 50 having, for example, a rectangular shape, a transparent and electrically insulating foundation layer 54 is formed, and on this foundation layer 54, a rectangular crystalline or polycrystalline silicon layer 56, which is separated like an island per TFT element, is formed. In the silicon layer 56, a source area S and a drain area D are formed in predetermined separate positions. Between the source area S and the drain area D, a channel area C is formed. Further on the silicon layer 56, a gate insulating layer 58 is formed. On the gate insulating layer 58, a layer or film for gate electrode is formed. This layer for gate electrode is etched by using the mask pattern of a gate electrode 60, thereby forming the gate electrode 60. On the surfaces of the gate electrode 60, the gate insulating layer 58, and the foundation layer 54, an interlayer insulating film, is formed. On an interlayer insulating film 66, the resist film 30 is formed. The glass base plate 28 where the resist film is formed is carried into a predetermined position of an X-Y-Z-θ stage (not shown) of the exposure apparatus shown in FIG. 1. The transmitting light having passed the ATT mask 24, which has the contact holes shown in FIG. 2, enters the resist film 30, which is then exposed. The exposed resist film 30 is developed, and the mask pattern of the contact holes is formed on the resist film 30. By using the resist film 30 where the mask pattern of the contact holes is formed as a mask, the interlayer insulating film 66 shown in FIG. 9 is etched, thereby forming the contact holes 68. At the same time, the gate insulating layer 58 is formed on the surface that is to be the channel area of the silicon layer 56.

The gate electrode 60 is formed on the gate insulating layer 58 so as to extend in the width direction of the silicon layer 56 at the longitudinal central part of the silicon layer 56.

The source area S and the drain area D are formed within the silicon layer 56 by ion implantation of predetermined impurities into the silicon layer 56 exposed in the bottom portion through the contact holes 68 formed in the interlayer insulating film 66. Next, a source electrode 62 and a drain electrode 64 are formed within the contact holes 68 by filming material layers to form the source electrode and the drain electrode on the silicon layer 56 exposed in the bottom portion, for example, by sputtering.

The source electrode 62 and the drain electrode 64 are respectively formed on the source area S and the drain area D, which are formed by ion-implantation of impurities into the silicon layer 56 with the gate electrode 60 as a mask in an electrically connected state through the contact holes 68.

The gate electrode 60, the source electrode 62, and the drain electrode 64 are respectively electrically insulated by interlayer insulation film or layers 66.

In the TFT 52 shown in FIGS. 8 and 9 using the exposure apparatus 10 in FIG. 1 in a part of a production process, the plural contact holes 68 for forming the source electrode 62 and the drain electrode 64 are formed, penetrating the interlayer insulation film 66 such that the bottom portions of the contact holes 68 may become the surfaces of the source area S and the drain area D.

To form the contact holes 68 in the interlayer insulating film 66, the resist film 30 is formed on the interlayer insulating film 66 and exposed by the exposure apparatus 10 and then developed. In this exposure process, the ATT mask 24 shown in FIG. 2 is used in the exposure process. By this exposure process, a mask for forming the contact holes 68 in the interlayer insulating film 66 is formed. By selectively etching or plasma-etching the interlayer film 66 by using this mask, the contact holes 68 are formed in the interlayer insulating film 66. When the resist film 30 is selectively exposed by using the ATT mask 24 having the rectangular pattern shown in FIG. 2A and then developed, the rectangular contact holes 68 with at least the corner portions arc-shaped are formed on the resist film 30 as shown in FIG. 8.

Figure 3:
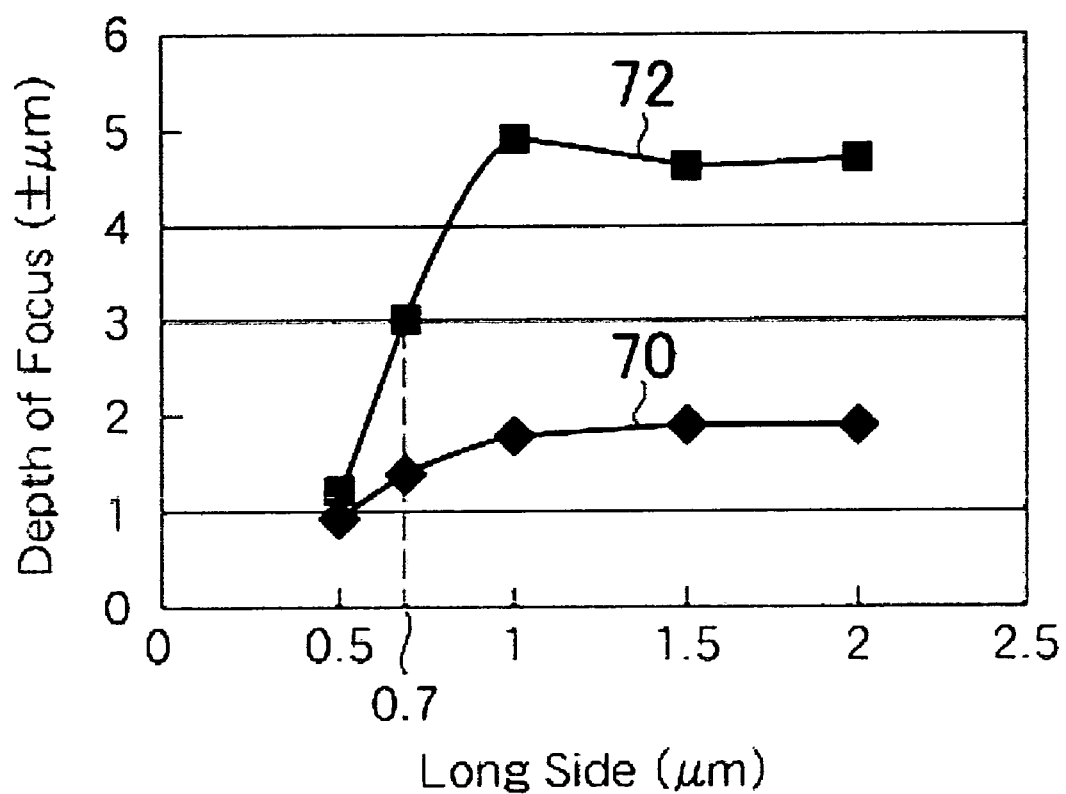
FIG. 3 is characteristic curves of the chrome mask and the ATT mask showing a relation between the length of the long sides and the depth of focus of the projection optical system when the length of the long sides of a rectangular mask pattern is varied, obtained by a first embodiment.

The depth of focus in case of such rectangular contact holes, as shown in FIG. 3, becomes deeper as the long sides become longer. Because the depth of focus is deep, it is suitable for exposing the resist coated on the glass base plate with great variation in plate thickness.

By selectively etching the interlayer insulating film 66 by using this mask, the contact holes 68 are formed in the interlayer insulating film 66.

As multiple contact holes 68 are arranged at equal intervals and equal pitches, a hole-and-space pattern is formed on the resist film 30.

Embodiment 1

In the ATT mask 24, by making a plurality of ATT masks 24 with the short sides of the rectangular area 40 which becomes, for example, a light transmitting area for forming the contact holes 68 in the resist film 30 fixed, for example, at 0.5 μm and with the long sides varied, the resist film 30 was exposed by the exposure apparatus 10 shown in FIG. 1 so as to form rectangular contact holes in the resist film 30. Together with these plural ATT masks 24, a plurality of chrome masks having the same shape as the ATT masks 24 were used.

The coherence factor σ (Sin φ/Sin α) of the projection optical system 26 of equal magnification was fixed, for example, at 0.8. Also, the i-ray with 365 nm wavelength as a ray for exposure and a chemical amplitude-type resist material for i-ray as the resist film 30 were respectively used. Further, a pitch XP between hole centers in the X direction of the areas 40 in FIG. 2 was made the sum of the long side and the short side (0.5 μm), and a pitch YP between hole centers in the Y direction was made a quadruple (2 μm) of the short side (0.5 μm).

When the chrome mask was used, the numerical aperture NA2 was determined as follows: 0.37 in case the light transmitting area 40 is a square each side of which is 0.5 μm long; 0.33 in case of a rectangle measuring 0.5 μm×0.7 μm; 0.29 in case of a rectangle measuring 0.5 μm×1 μm; and 0.28 in case of rectangles respectively measuring 0.5 μm×1.5 μm and 0.5 μm×2 μm.

When the ATT mask 24 was used, the numerical aperture NA2 was determined as follows: 0.35 in case the light transmitting area 40 is a square whose one side is 0.5 μm long; 0.25 in case of rectangles respectively measuring 0.5 μm×0.7 μm and 0.5 μm×1 μm; and 0.26 in case of rectangles respectively measuring 0.5 μm×1.5 μm and 0.5 μm×2 μm.

FIG. 3 shows the relationship between the depth of focus of the projection optical system 26 that resulted from the above embodiment 1 and the length dimension of the long side of the area 40 in the ATT mask 24 in FIG. 2. In FIG. 3, a curve 70 with ♦ marks shows the characteristic of depth of focus of the projection optical system 26 of the exposure apparatus 10, when the chrome mask was used, while a curve 72 with ■ marks shows the results when the ATT mask 24 was used. The axis of abscissa in FIG. 3 shows a length of the long sides of the area 40 shown in FIG. 2, while the vertical axis shows the depth of focus of the projection optical system 26 of the exposure apparatus 10. A characteristic of the deep depth of focus is obtained when the length of the long sides of the area 40 is 0.7 μm or over. In other words, in the axis of abscissa, the proportion of the long side and the short side is 1.4 times when the long side is 0.7 μm; twice when the long side is 1 μm; quadruple when the long side is 2 μm; and five times when the long side is 2.5 μm. In the ATT mask 24 shown in FIG. 2, the characteristic of the deep depth of focus is obtained in case of a rectangular pattern where the length in the direction of the long sides becomes at least 1.4 times as long as the length of the short sides in the rectangular pattern for forming the contact holes.

Whichever ATT mask 24 is used, the contact holes were formed on the resist film 30 to penetrate it, and those contact holes had an oval shape corresponding to the rectangular light transmitting area (40) as shown in FIG. 2(A).

As is clear from FIG. 3, if the long side of the area 40 is longer than the short side (0.5 μm), the depth of focus of the projection optical system 26 becomes deep to an extent that the long side is up to 1 μm, and if the long side is longer than that, the depth of focus becomes substantially constant. As a result, by making the area 40 rectangular in FIG. 3, the depth of focus of the exposure apparatus 10 becomes deep.

As is clear from FIG. 3, when the length of the long sides is made at least 1.4 times (0.7 μm) as long as the length of the short sides in the area 40, the depth of focus of the projection optical system 26 becomes deeper than when either the light transmitting area or the light screening area is square. The deep depth of focus can be steadily obtained at a periodical pattern in case of the contact hole pattern when the pitch in the direction of the long side of the rectangle becomes equal to or greater than the sum of the length dimension of the long side and the length dimension of the short side and the pitch in the direction of the short side becomes triple or more the length dimension of the short side. The contact holes may be in either the light transmitting area or the light screening area.

The characteristic curve 70 in FIG. 3 shows a characteristic in case of using the chrome mask with a light transmitting area for the area 40. It is understood that, in this case, too, the depth of focus becomes deep by making the contact holes rectangular. It is therefore understood that the present invention is also effective for an ordinary chrome mask.

It is understood that, when the ATT mask 24 is used, the depth of focus becomes remarkably deep. Thus even on a glass base plate with a great plate thickness variation, a deep depth of focus can be used to form the contact holes 68 in the resist film 30 to perfectly penetrate it, thereby improving a yield ratio of the TFT production.

Embodiment 2

In the same shape as the ATT mask 24 shown in FIG. 2, a chrome mask with the short side of the rectangular light transmitting area or the light screening area 40 fixed at 0.5 μm and the long side at 1 μm, respectively, is made, and by using the chrome mask, the resist film 30 was exposed by the exposure apparatus 10 shown in FIG. 1 with the numerical aperture NA2 of the projection optical system 26 of equal magnification varied so as to form a plurality of contact holes, that is, dense contact holes arranged at a high density on the resist film 30.

In this embodiment, too, the coherence factor σ was fixed at 0.8. Also, the i-ray of 365 nm in wavelength as an exposure ray and the chemical amplitude type resist for i-ray as the resist film 30, respectively, were used. Further, the pitch XP in the X direction of the area 40 in FIG. 2 was made 1.5 μm, and the pitch YP in the Y direction was made 2 μm.

Figure 4:
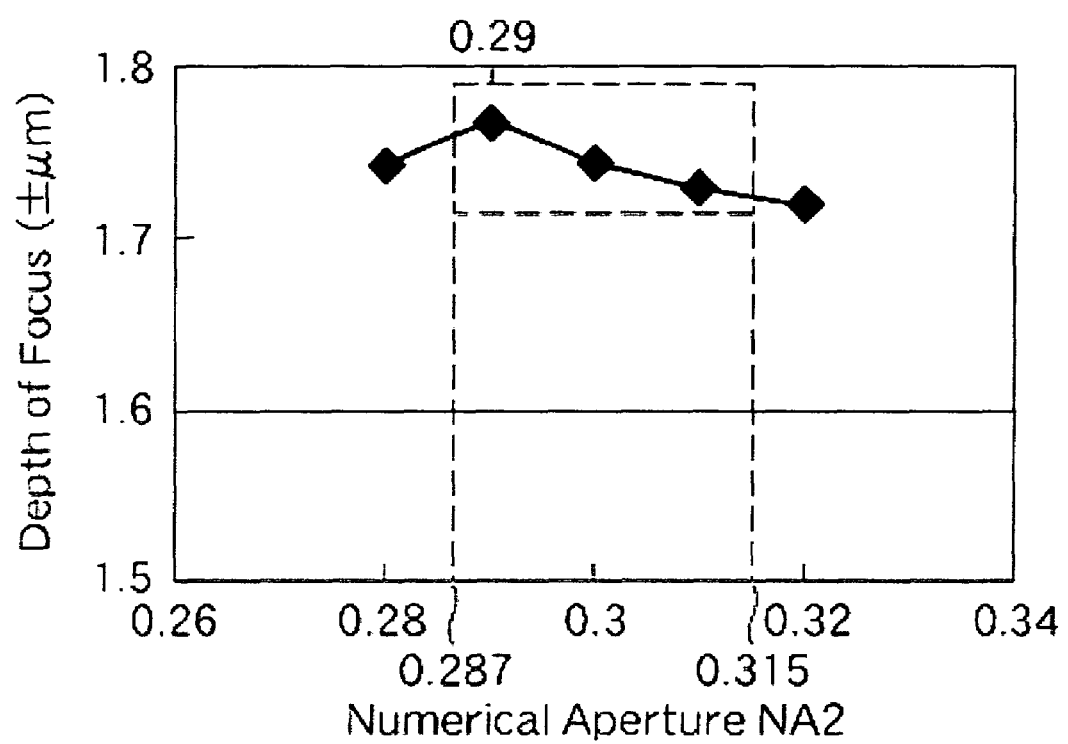
FIG. 4 is a characteristic curve showing a relation between the numerical aperture and the depth of focus of a projection optical system of equal magnification of the exposure apparatus in FIG. 1, obtained by a second embodiment.

FIG. 4 shows the relationship between the depth of focus of the projection optical system 26 of equal magnification that resulted from the above-mentioned embodiment 2 and the numerical aperture NA2 of the projection optical system 26 of equal magnification. In either case, the contact holes 68 are formed on the resist film 30, perfectly penetrating it, and the contact holes 68 have a rectangular shape as shown in FIG. 2A.

As is clear from FIG. 4, the depth of focus becomes the deepest when the numerical aperture NA2 of the projection optical system 26 of equal magnification is 0.29. The deep depth of focus is obtained when the numerical aperture NA2 is 0.287 to 0.315. Also, when the light transmitting area or the light screening area 40 is a rectangle, the depth of focus generally becomes as deep as ±1.7 μm or deeper.

In FIG. 4 concerning the embodiment 2, the depths of focus become substantially the same when the numerical apertures NA2 of the projection optical system 26 of equal magnification are 0.28 and 0.3, respectively. When the lens aberration is taken into consideration, the depth of focus when the numerical aperture NA2 of the projection optical system 26 of equal magnification is 0.28 becomes shallower, so that it is optimum when the range of the numerical aperture NA2 is between 0.29 and 0.315.

From such a range of the numerical aperture NA2 of the projection optical system of equal magnification as above, the range of k1, 0.40 to 0.43, corresponding thereto can be obtained. The range of this k1 can be obtained in the following manner.

In the formula (1) above, when R is set at 0.5 and NA2 as 0.29, k1 becomes 0.40. Likewise, by setting R at 0.5 and NA2 as 0.315, k1 becomes 0.43.

Embodiment 3

A chrome mask of the same shape as that of the mask 24 shown in FIG. 2 was prepared with the short sides of the rectangular light transmitting area or the light screening area 40 fixed at 0.5 μm and the long side at 1 μm. By using the prepared chrome mask, the resist film 30 was exposed by the exposure apparatus 10 shown in FIG. 1 with the coherence factor σ of the projection optical system 26 of equal magnification varied so as to form dense contact holes on the resist film 30.

At this time, the numerical aperture NA2 of the projection optical system 26 of equal magnification was fixed at 0.29.

Also, the i-ray of 365 nm in wavelength and the chemical amplitude type resist for i-ray were used, respectively, as the ray for exposure and as the resist film 30. Further, the pitch XP in the X direction of the light transmitting area or the light screening area 40 in FIG. 2 was set at 1.5 μm and the pitch YP in the Y direction at 2 μm.

Figure 5:
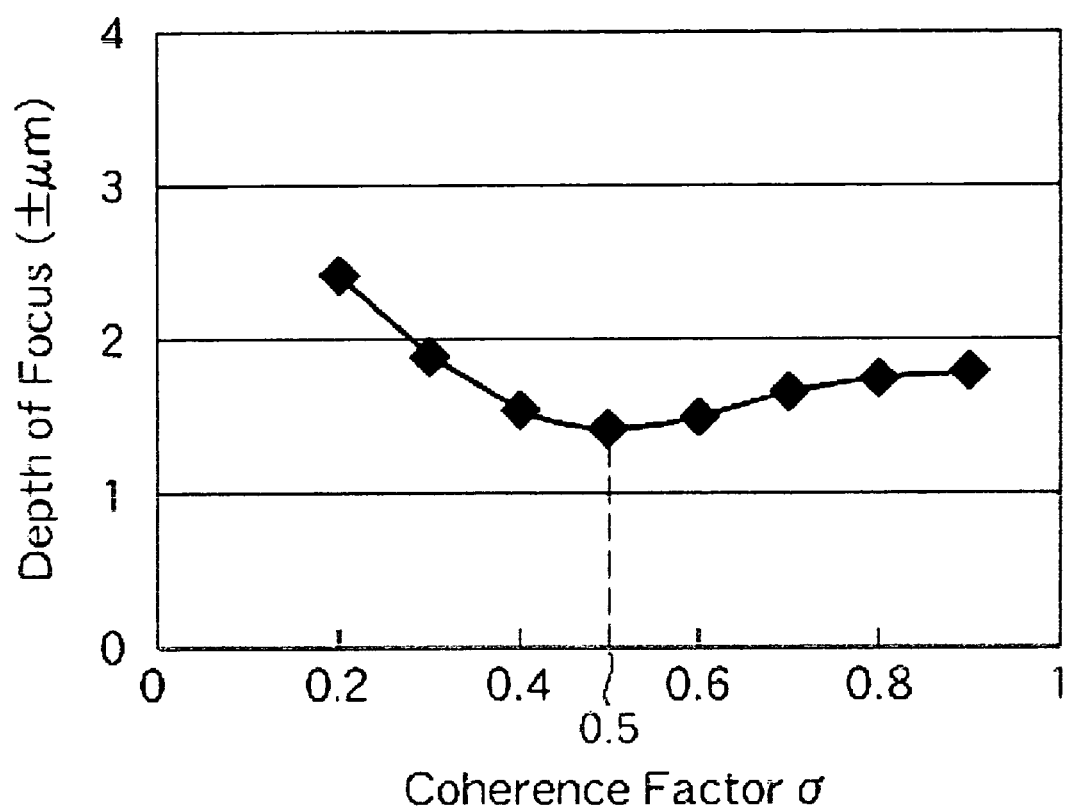
FIG. 5 is a characteristic curve graph showing a relation between the coherence factor and the depth of focus of a projection optical system of equal magnification of the exposure apparatus in FIG. 1, obtained by a third embodiment.

FIG. 5 shows the relationship between the depth of focus of the projection optical system 26 of equal magnification and the coherence factor σ of the projection optical system 26 of equal magnification resulting from the above embodiment 3. In either case, contact holes perfectly penetrating the resist film 30 were formed on the resist film 30, and the contact holes had an oval shape in correspondence to the rectangle 40 shown in FIG. 2A.

As is clear from FIG. 5, there is a tendency that the depth of focus becomes minimum when the coherence factor σ is 0.5. FIG. 5 shows that the depth of focus becomes deeper when the coherence factor σ is 0.5 or over and 0.5 and less.

Also, in case the area 40 is rectangular, the depth of focus becomes deeper in the whole area than in case the light transmitting area or the light screening area 40 is square, and evidently there is no need to restrict the coherence factor σ in the chrome mask.

Embodiment 4

In the ATT mask 24 shown in FIG. 2, the ATT mask 24 with the short sides of the rectangular light transmitting area or the light screening area 40 fixed at 0.5 μm and the long sides thereof at 1 μm was prepared. In order to use the ATT mask 24 for exposure and to form dense contact holes on the resist film 30, the resist film 30 was exposed with the numerical aperture NA2 of the projection optical system 26 of equal magnification varied.

The coherence factor σ was fixed at 0.8. Also, the i-ray of 365 nm in wavelength and the chemical amplitude type resist for i-ray were respectively used as the exposure ray and as the resist film 30. Further, the pitch XP in the X direction of the light transmitting area or the light screening area 40 in FIG. 2 was set at 1.5 μm and the pitch YP in the Y direction at 2 μm.

Figure 6:
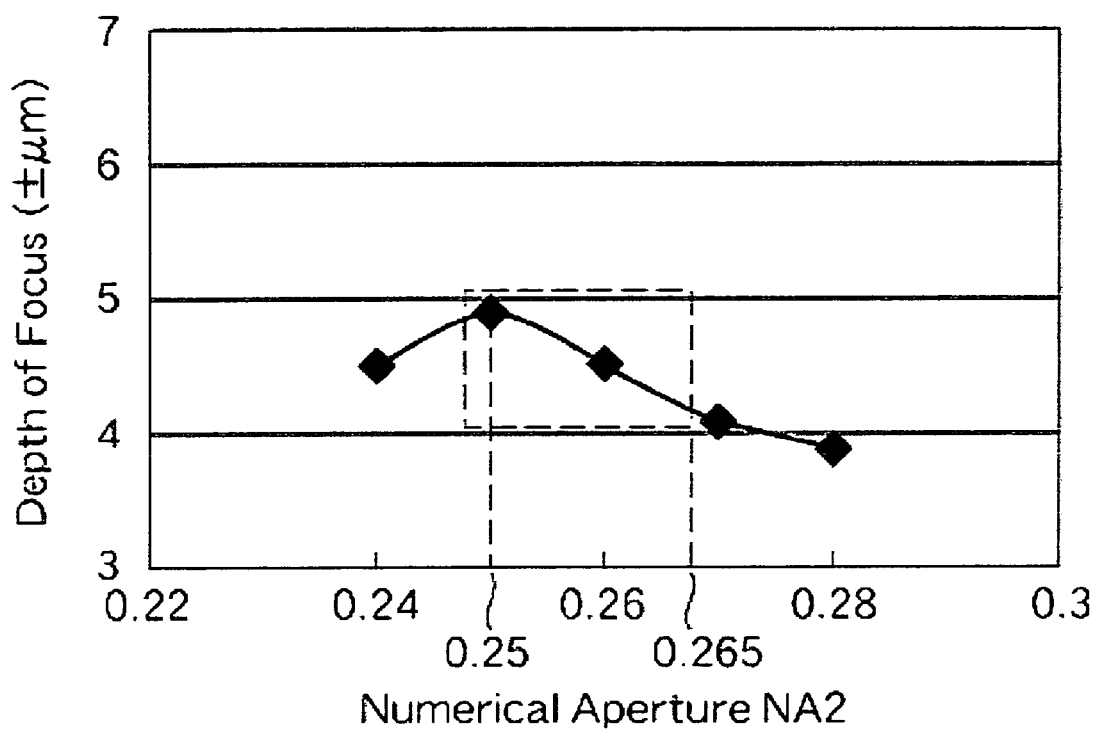
FIG. 6 is a characteristic curve showing a relation between the numerical aperture and the depth of focus of a projection optical system of equal magnification of the exposure apparatus in FIG. 1, obtained by a fourth embodiment.

FIG. 6 shows the relationship between the depth of focus of the projection optical system 26 of equal magnification that resulted from the above embodiment 4 and the numerical aperture NA2. In either case, holes perfectly penetrating the resist film 30, for example, the contact holes, were formed on the resist film 30, and the contact holes had a rectangular shape in correspondence to the rectangle 40 shown in FIG. 2A.

As is clear from FIG. 6, the depth of focus becomes the deepest when the numerical aperture NA2 of the projection optical system 26 of equal magnification is 0.25. The depths of focus become substantially the same when the numerical aperture NA2 of the projection optical system 26 of equal magnification is 0.24 and when it is 0.265, but when the lens aberration is taken into consideration, because the depth of focus becomes shallower when the numerical aperture NA is 0.24, the range of the numerical aperture NA2 is preferably between 0.25 and 0.265.

FIG. 4 shows a characteristic of an ordinary chrome mask, while FIG. 6 shows a characteristic of an ATT mask. Comparison between FIG. 4 and FIG. 6 reveals that the depth of focus becomes deeper in case of the ATT mask and is very effective when exposing and forming a TFT on a glass base plate.

Embodiment 5

In the ATT mask 24 shown in FIG. 2, an ATT mask 24 with the short side of the rectangular area 40 fixed at 0.5 μm and the long side fixed at 1 μm is prepared, and in order to form dense contact holes on the resist film 30 by using the ATT mask 24, the resist film 30 was exposed by the exposure apparatus 10 shown in FIG. 1 with the coherence factor σ varied.

The numerical aperture NA2 was fixed at 0.25. Also, an i-ray of 365 nm in wavelength and the chemical amplitude-type resist for i-ray were used, respectively, as the light source 12 and the resist film 30. Further, the pitch XP in the X direction of the area 40 in FIG. 2 was set at 1.5 μm, and the pitch YP in the Y direction was set at 2 μm.

Figure 7:
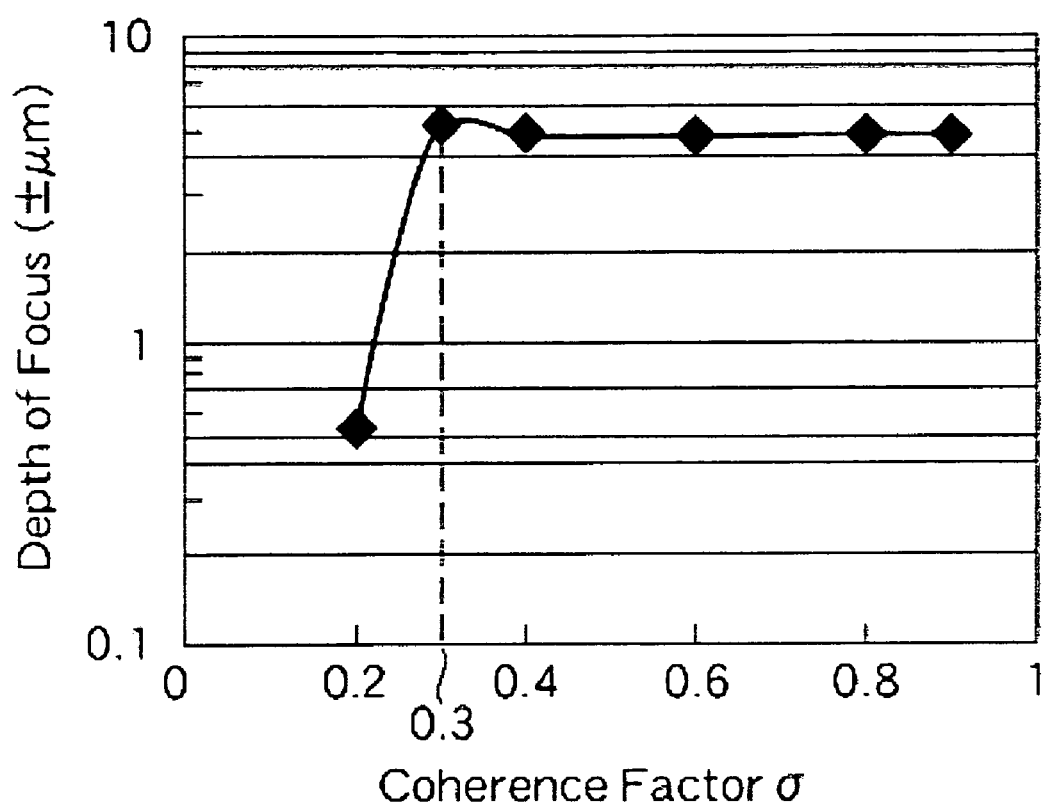
FIG. 7 is a characteristic curve showing a relation between the coherence factor and the depth of focus of a projection optical system of equal magnification of the exposure apparatus in FIG. 1, obtained by a fifth embodiment.

FIG. 7 shows the relationship between the depth of focus of the projection optical system 26 of equal magnification resulting from the embodiment 5 and the coherence factor σ. In either case, contact holes 68 perfectly penetrating the resist film 30 were formed on the resist film 30, and the contact holes 68 had an oval shape in correspondence to the rectangle (40) shown in FIG. 2(A).

FIG. 5 shows a characteristic of an ordinary chrome mask, while FIG. 7 shows a characteristic of an ATT mask. Comparison between FIG. 5 and FIG. 7 reveals that the depth of focus becomes deeper in case of the ATT mask and is very effective when exposing and forming a TFT on a glass base plate.

Where the coherence factor σ is 0.3 or more, the depth of focus of the projection optical system 26 of equal magnification when the area 40 is rectangular becomes deeper than when the area 40 is square (the shape of the mask), so that evidently there is no need to restrict the coherence factor σ even in case of the ATT mask. Here, "when the area 40 is square" means a case where the long side in FIG. 3 is 0.5 μm. Comparison was made between 1.2 μm, which is the depth of focus in this case, and the depth of focus where the coherence factor σ in FIG. 7 is 0.3 or more.

In such a case as above, a predetermined resolution 0.5 μm is obtainable even if the numerical aperture NA2 is changed up to 0.3. From such a range of the numerical aperture NA2, i.e., between 0.25 and 0.3, the corresponding range of k1 can be obtained. In other words, where R is the length dimension (0.5 μm) in the direction of the short sides of the rectangle in the above formula (1), the range of k1, i.e., between 0.34 and 0.41, can be obtained by substituting each critical value between 0.34 and 0.41 in the above formula (1).

As is clear from the foregoing embodiments 2 through 5, if the resolutions are the same, in case that the area 40 is rectangular, it can be exposed with smaller numerical aperture NA2 than where the area 40 is square. In such a way, when the numerical aperture NA2 becomes small, a degree of difficulty for producing lenses lowers.

Further, while the contact holes 68 for forming electrodes 62, 64 of the source area S and the drain area D of the TFT 52 are explained in the foregoing embodiments, these techniques may be used not only for forming the contact holes 68 but for wiring the gate electrode 60. Further, needless to explain, the contact holes provided in the wiring for connecting the TFTs 52 to each other and electric source terminals to each other can be likewise formed on the interlayer insulating film 66, resulting in the same effect.

Although the mask pattern for forming contact holes was rectangular in the foregoing embodiments, an oval-shaped mask pattern also enables obtainment of a practicable depth of focus of the projection optical system 26 of equal magnification.

Next, an exemplary method of exposure is described.

Figure 10:
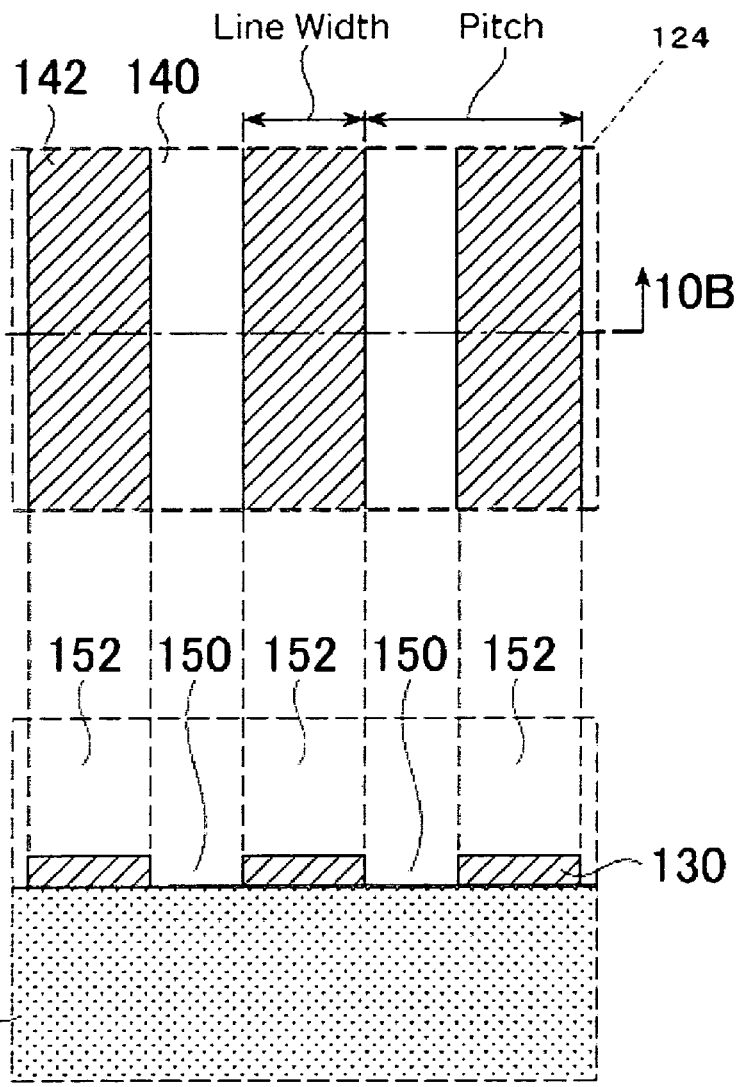
FIGS. 10A and 10B are views for explaining one embodiment of an ATT mask to be used in the exposure process for explaining the exposure method according to the present invention and a resist pattern exposed to a transmitted light of the ATT mask and then developed.

The ATT mask 124 to be used for the method of exposure can be, as shown, e.g., in FIG. 10A, an ATT phase shift mask for line having a line-and-space pattern with light transmitting portions 140 and light screening portions 142 having the same width dimension formed at equal intervals and equal pitches. FIGS. 10A and 10B are views for explaining an embodiment of the ATT mask 124 and the resist pattern exposed to the transmitting light through there and then developed, of which FIG. 10A is a plan view of the ATT mask 124, and FIG. 10B is a section of the processed base plate for explaining an exposed state of the mask pattern obtained along the line 10B-10B in FIG. 10A.

Figure 11:
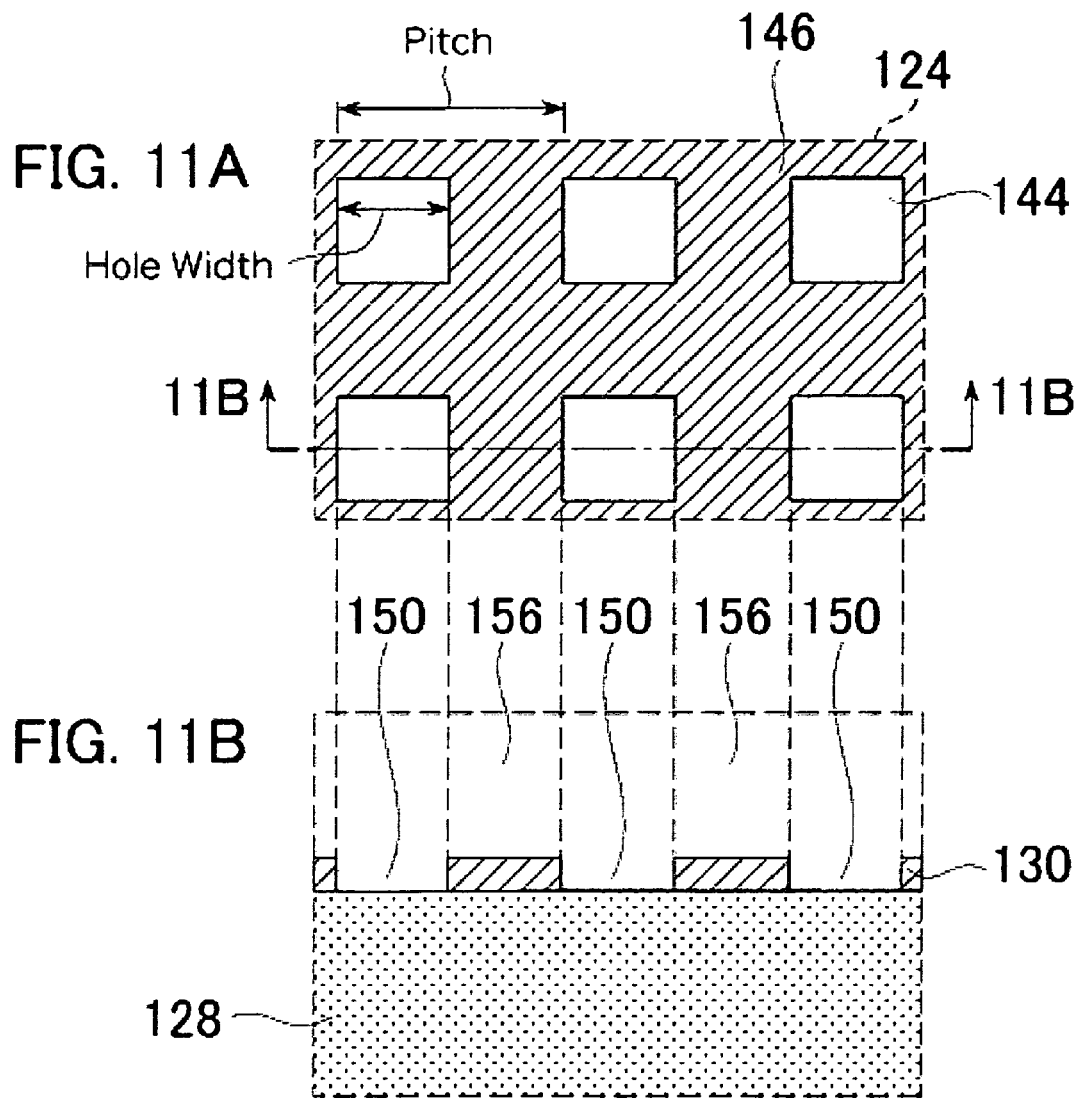
FIGS. 11A and 11B are views for explaining one embodiment of an ATT mask to be used in the exposure process for explaining the exposure method according to the present invention and a resist pattern exposed to a transmitted light of the ATT mask and then developed.

The ATT mask 124 can also be an ATT phase shift mask for contact holes having a dense contact hole pattern with light transmitting portions 144 having the same width dimension formed in a matrix-like shape at equal pitches, as shown in FIG. 11A. In the illustration, the dimension between the light transmitting portions 144 (i.e., light screening portions 146) is the same as the width dimension of the light transmitting portions 144. FIGS. 11A and 11B are views for explaining an embodiment of the ATT mask 124 and the resist pattern exposed to the transmitting light through there and then developed. FIG. 11A is a plan view of the ATT mask, and FIG. 11B is a section of the processed base plate for explaining an exposed state of the mask pattern obtained along the line 11B-11B in FIG. 11A.

Whichever above-mentioned pattern the ATT mask 124 may have, it is possible to use as the ATT mask 124 either one comprising the light screening portions 142, 146 having a 6-8% transmittance and the light transmitting portions 140, 144 having a substantially 100% transmittance and capable of shifting the phase of the light by 180°, or one comprising the light screening portions having a 6-8% transmittance and capable of shifting the phase of the light by 180° and the light transmitting portions having a substantially 100% transmittance.

The materials of the light screening portions 142 and 146 vary with the types of the ATT mask 124, it is possible to use publicly known materials on the market. Whichever type of the ATT mask 124 is used, the ATT mask 124 having such a pattern is produced before exposure of the resist layer 130.

By exposing the resist layer 130 by the exposure apparatus 10 shown in FIG. 1 by use of the ATT mask 124 having the pattern shown in FIG. 10A and by developing the resist layer 130 after the exposure, a line-and-space pattern comprising remaining portions of the resist layer 130 at equal intervals and equal pitches as shown by section in FIG. 10B and portions from which the resist layer was removed, that is, spaces 150 are formed in the resist layer 130 on a glass base plate 128.

In the pattern shown in FIG. 10B, the spaces 150 left after the resist layer 130 was removed correspond to the light transmitting portions 140 of the pattern in FIG. 10A, and portions 152 where the resist layer 130 remains correspond to the light screening portions 142 of the pattern in FIG. 10A.

When the resist layer 130 is exposed in the exposure apparatus 10 by use of the ATT mask 124 having the mask pattern shown in FIG. 11A and the resist layer 130 is developed after the exposure, a dense contact hole pattern with contact holes at equal intervals and equal pitches as shown by section in FIG. 11B is formed in the resist layer 130 on the glass base plate 128.

In the exposure pattern shown in FIG. 11B, the spaces 150 left after removing the resist layer 130 correspond to the light transmitting portions 144 in FIG. 11A, and portions 156 where the resist layer 130 remains corresponds to the light screening portions 146 in FIG. 11A.

Figure 12:
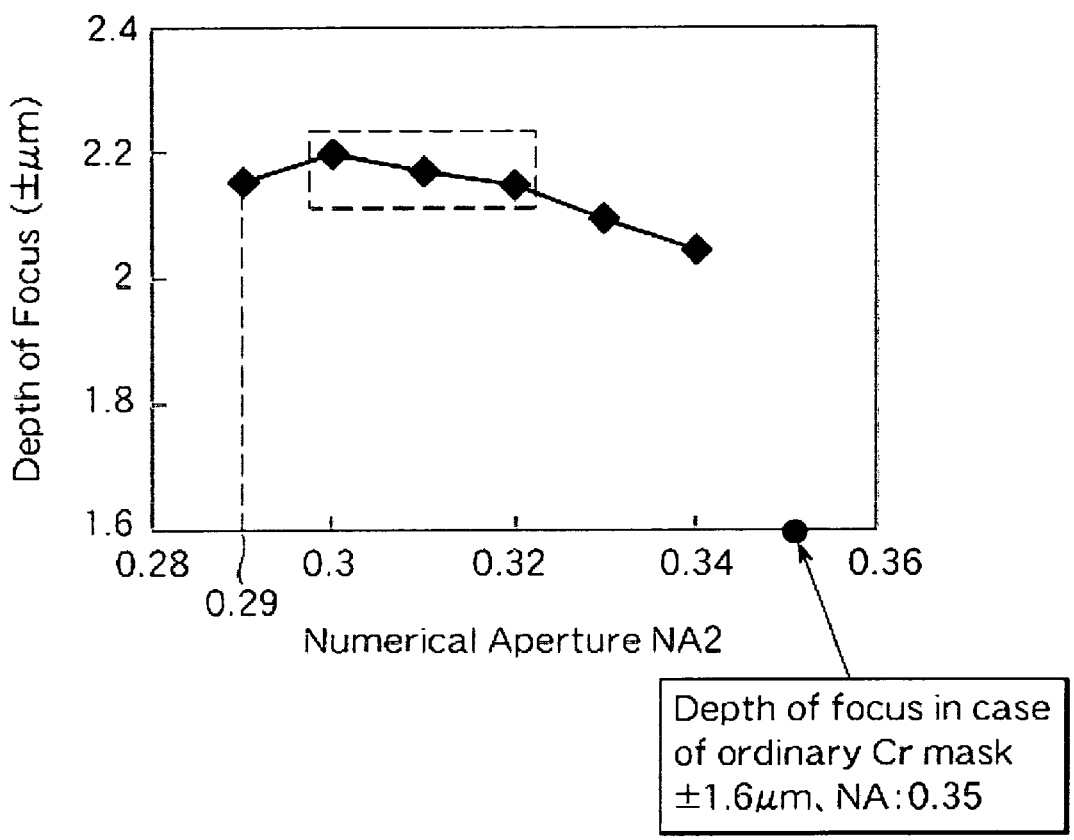
FIG. 12 is a characteristic curve showing a relation between the numerical aperture and the depth of focus of a projection optical system of equal magnification of the exposure apparatus in FIG. 1, obtained by a sixth embodiment.
Figure 13:
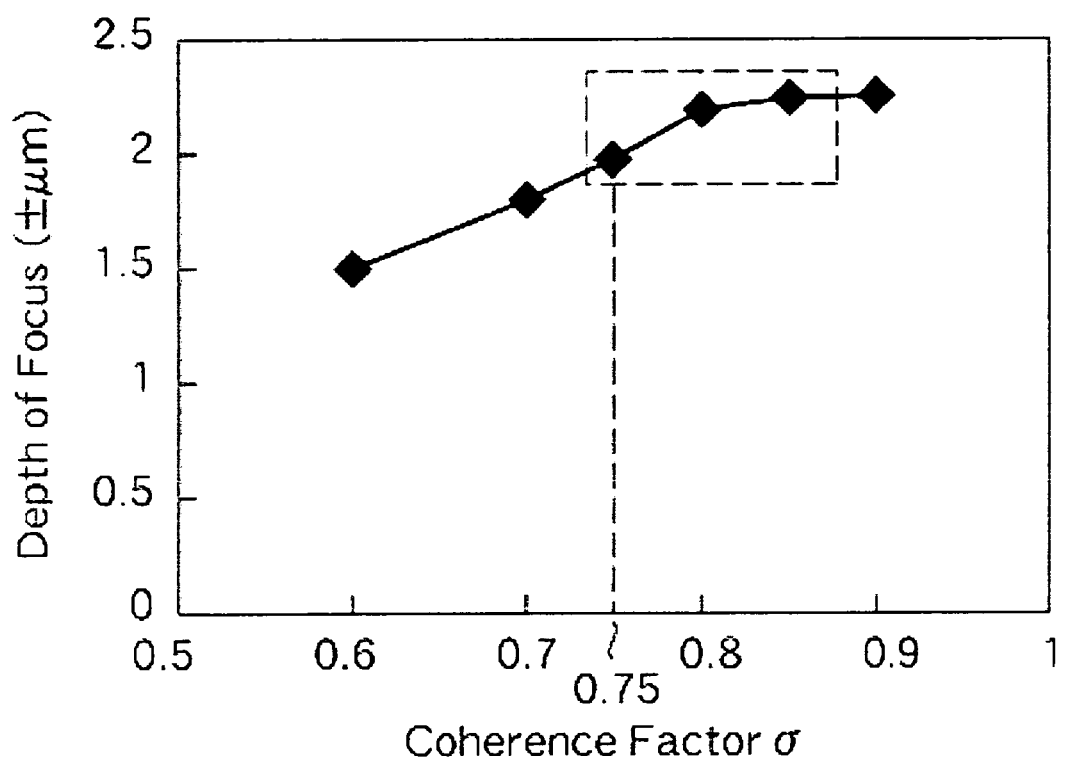
FIG. 13 is a characteristic curve showing a relation between the coherence factor and the depth of focus of a projection optical system of equal magnification of the exposure apparatus in FIG. 1, obtained by a seventh embodiment.

For instance, in the above-mentioned first exposure method, if a photoresist (the chemical amplitude type resist for i-ray) having a line-and-space pattern with lines arranged at equal intervals of 0.5 µm in width is to be formed, the numerical aperture NA2 is ranged from 0.3 to 0.32 in the deep area of the depth of focus of the projection optical system 26 of equal magnification as shown by the rectangular dotted frame in FIG. 12, and the coherence factor σ ranges approximately from 0.75 to 0.85 (usually likewise in case of Cr mask) in the deep area of the depth of focus as shown by the rectangular dotted line in FIG. 13. When the coherence factor σ is 0.85 or greater, the depth of focus is deep, but it is very difficult to produce an actual exposure optical system with such a coherence factor σ. Therefore, the coherence factor σ is set approximately between 0.75 and 0.85. Also, in the above formula (1), when R=0.5 µm, the range of k1, i.e., between 0.41 and 0.44, can be obtained by substituting both critical values, between 0.3 and 0.32, of the numerical aperture NA2 range in the above formula (1).

Also, for instance, if the chemical amplitude type resist for i-ray having a line-and-space pattern including lines arranged at equal intervals of 0.8 µm in width is to be formed by the i-ray (365 nm in wavelength) from the light source 12, from the characteristic of the rectangular dotted frame in FIG. 12, the numerical aperture NA2 ranges from 0.18 to 0.2, and the coherence factor σ ranges approximately from 0.75 to 0.85.

Figure 15:
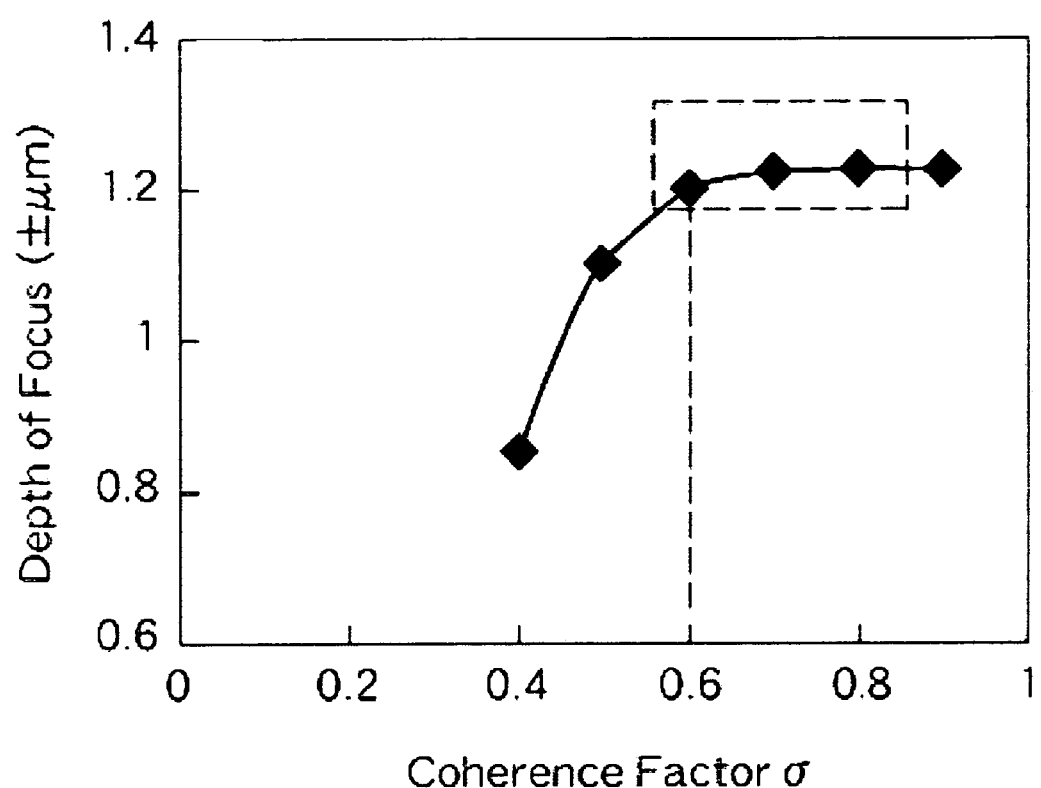
FIG. 15 is a characteristic curve showing a relation between the coherence factor and the depth of focus of a projection optical system of equal magnification of the exposure apparatus in FIG. 1, obtained by a ninth embodiment.
Figure 17:
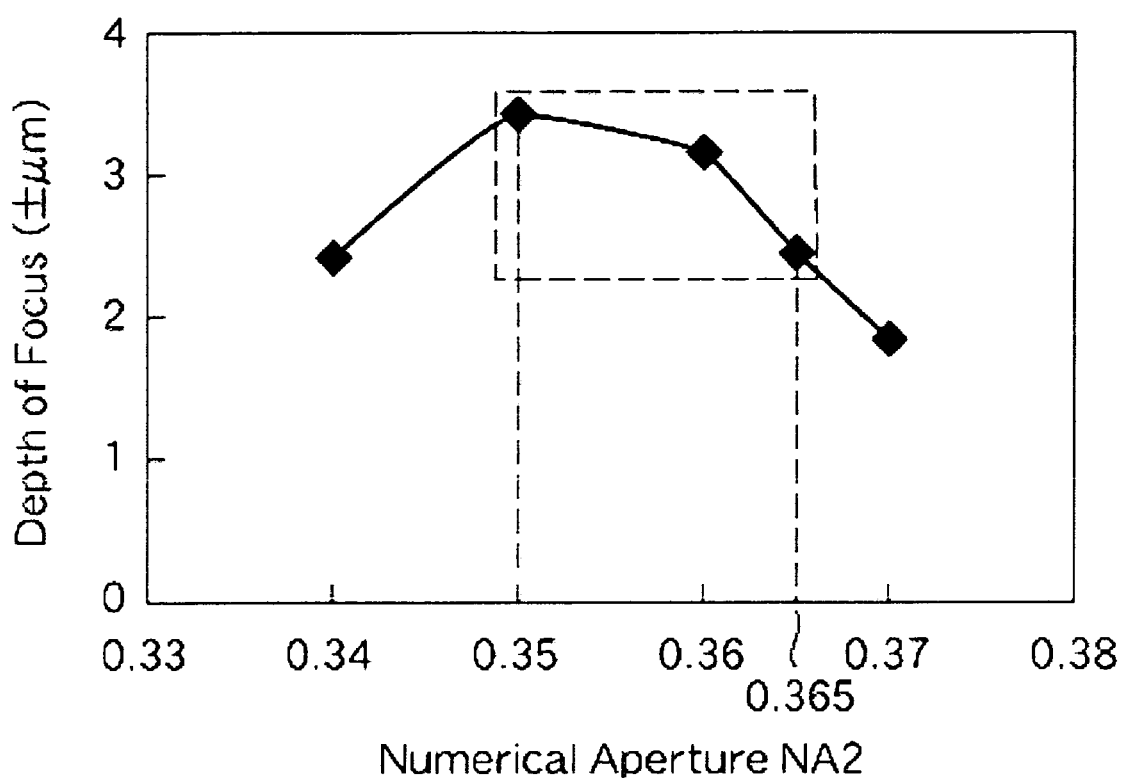
FIG. 17 is a characteristic curve showing a relation between the numerical aperture and the depth of focus of a projection optical system of equal magnification of the exposure apparatus in FIG. 1, obtained by an eleventh embodiment.

For instance, in the above-mentioned second exposure method according to the present invention, if a transmitting light image of the mask 124 of a contact hole pattern (with dense contact holes arranged at hole pitches of 1 µm) including holes with a bore diameter of 0.5 µm at equal intervals on the resist (the chemical amplitude type resist for i-ray) by the i-ray (365 nm in wavelength) from the exposure source, from FIG. 17, the numerical aperture NA2 of the projection optical system 26 of equal magnification ranges from 0.35 to 0.365, and from FIG. 15, the coherence factor σ ranges approximately from 0.6 to 0.85 (usually likewise in case of Cr mask). Also, in the formula (1), when R=0.5 µm, the corresponding range of k1, i.e., between 0.48 and 0.5, can be obtained by substituting both critical values, between 0.35 and 0.365, of the numerical aperture NA2 range in the formula (1).

Also, for instance, when the transmitting light image of the ATT mask 124 having a dense contact hole pattern (with a hole pitch of 1.6 µm) including multiple holes having a bore diameter of 0.8 µm is to be formed by the i-ray (365 nm in wavelength) from the exposure source 12 on the photoresist film 130 (the chemical amplitude type resist for i-ray), the numerical aperture NA2 ranges from 0.22 to 0.23, and the coherence factor σ of the projection optical system 26 of equal magnification ranges approximately from 0.6 to 0.85 (usually likewise in case of Cr mask). In this case, the shape of the holes of the ATT mask 124 is square, but the shape of the resist pattern actually formed is circular.

For instance, in the above-mentioned third exposure method, in case holes having a bore diameter of 0.5 µm are to be formed, the pitch between the centers of the holes of the ATT mask 124 becomes 1.2 µm or over. Also, the numerical aperture NA2 of the projection optical system 26 of equal magnification ranges from 0.35 to 0.365, and the coherence factor σ of the projection optical system 26 of equal magnification ranges approximately from 0.3 to 0.55. In this case, when R=0.5 µm, the corresponding range of k1, i.e., between 0.48 and 0.5, can be obtained by substituting both critical values between 0.35 and 0.365 of the numerical aperture NA2 range in the formula (1).

According to the exposure method using such an ATT mask 124, the depth of focus of the projection optical system 26 of equal magnification becomes deeper than in the usual case of Cr mask. As the depth of focus becomes deep, a highly fine pattern can be formed on the resist film 130 filmed on the glass base plate with great variation in plate thickness. Being able to form an image of a highly fine pattern on the resist film 130 filmed on the glass base plate with great variation in plate thickness means that a highly integrated circuit of the TFT can be formed on the glass base plate.

Also, in the exposure method of the present invention as mentioned above, if the resolution is the same as that of the usual Cr mask, it is possible to expose with the numerical aperture NA2 smaller than that of the usual Cr mask. If NA2 becomes so small as mentioned, it facilitates production of lenses.

Embodiment 6

In order to form a line-and-space pattern with lines at equal intervals having the line width of 0.5 μm and at equal pitch of 1 μm between line centers in the resist layer 130, the mask shown in FIG. 10A was used as the ATT mask 124 to expose the resist layer 130 by the exposure apparatus 10 shown in FIG. 1.

The i-ray of 365 nm in wavelength was used as the exposure ray, and the chemical amplitude type resist agent for i-ray was used as the resist layer 130.

Actually, a plurality of experiments were conducted by fixing the coherence factor σ at 0.8 and varying the numerical aperture NA2 corresponding to the convergent angle θ of the projection optical system 26 of equal magnification in FIG. 1.

FIG. 12 shows the relation between the depth of focus of the projection optical system 26 of equal magnification of the exposure apparatus 10 that resulted from the foregoing embodiment 6 and the numerical aperture NA2 of the projection optical system 26.

As is clear from FIG. 12, the depth of focus becomes the deepest when the numerical aperture NA2 of the projection optical system 26 of equal magnification is 0.3. Substantially the same depth of focus results when the numerical aperture NA is 0.29 and 0.32.

However, when the lens aberration is taken into consideration, the depth of focus becomes shallower when the numerical aperture NA is 0.29. It is therefore evident that a range of the numerical aperture NA2 is desirably between 0.3 and 0.32, as shown by the dotted frame in FIG. 12. Such a range of the numerical aperture shows a more favorable characteristic than that of the usual Cr mask.

At this time, R is 0.5 μm, and by substituting λ=365 nm and the range of the numerical aperture NA2, i.e., between 0.3 and 0.32 into the formula (1) called the Rayleigh formula to obtain a range of k1, a range from 0.41 to 0.44 can be obtained as k1.

Embodiment 7

In order to form a line-and-space pattern having equal intervals and equal pitches the same as those in embodiment 6 on the resist layer 130, the ATT mask 124 shown in FIG. 10A was used to expose the resist layer 130 under the same condition as in the embodiment 6 by the exposure apparatus 10.

What is different from the embodiment 6 is that a plurality of experiments were conducted by fixing the numerical aperture NA2 to 0.3 and varying the coherence factor σ, instead of fixing the coherence factor σ at 0.8 and varying the numerical aperture NA2.

FIG. 13 shows the relation between the depth of focus of the projection optical system 26 of the exposure apparatus that resulted from the foregoing embodiment 7 and the coherence factor σ.

As is clear from FIG. 13, the depth of focus of the projection optical system 26 of equal magnification becomes smaller in areas where the coherence factor σ is smaller than 0.8, and becomes much lower than ±2 μm when the coherence factor σ becomes lower than 0.75. However, when the coherence factor σ becomes larger than 0.8, the depth of focus becomes substantially constant.

The limit in production of the light source for the coherence factor σ is about 0.85 or over. It is therefore evident that the coherence factor σ is desirably between 0.75 and 0.85, as shown by the dotted frame in FIG. 13.

Embodiment 8

In order to form a dense contact hole pattern where a resist pattern has a plurality of rectangular holes in which one side is 0.5 μm long, i.e., 0.5 μm in bore diameter and the pitch between centers of the holes is 1 μm on the resist layer 130, the mask shown in FIG. 11(A) was used as the ATT mask 124 to expose the resist layer 130.

The i-ray of 365 nm in wavelength was used as an exposure ray, and the chemical amplitude-type resist agent for i-ray was used as the resist layer 130.

Actually, a plurality of experiments were conducted by fixing the coherence factor σ at 0.8 and varying the numerical aperture NA2.

Figure 14:
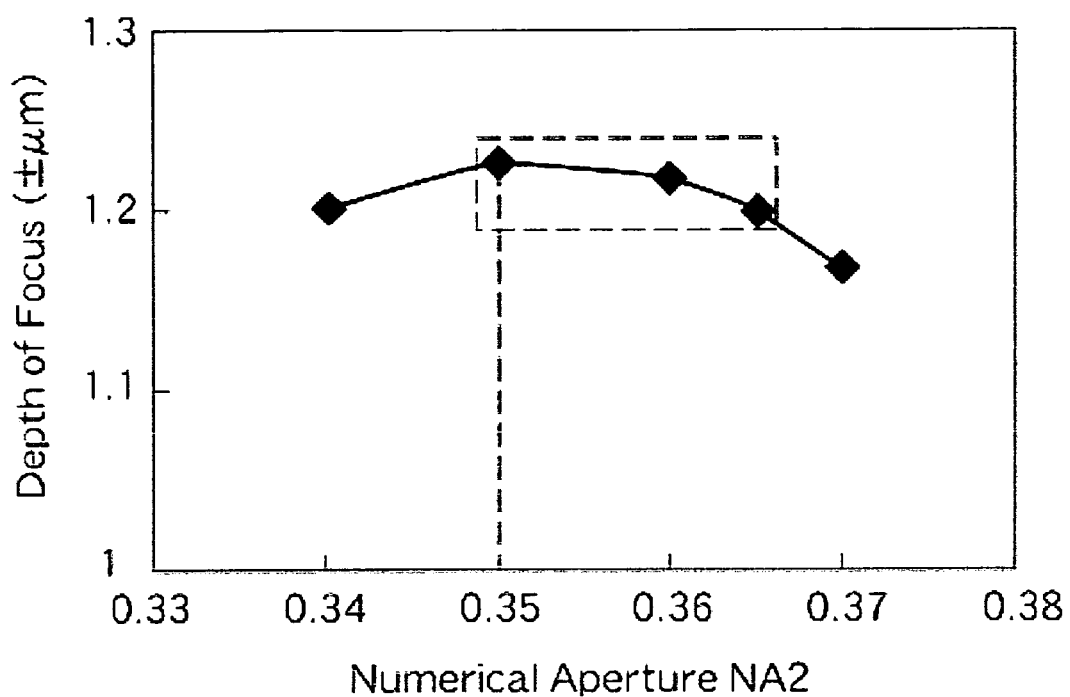
FIG. 14 is a characteristic curve showing a relation between the numerical aperture and the depth of focus of a projection optical system of equal magnification of the exposure apparatus in FIG. 1, obtained by an eighth embodiment.

FIG. 14 shows the relation between the depth of focus that resulted from the foregoing embodiment 8 and the numerical aperture NA2 of the projection optical system 26.

As is clear from FIG. 14, in the exposure apparatus 10 the depth of focus of the projection optical system 26 of equal magnification becomes the deepest when the numerical aperture NA2 is 0.35. Also, substantially the same depth of focus results when the numerical aperture NA2 is 0.34 and 0.365.

However, when the lens aberration is taken into consideration, the depth of focus of the projection optical system 26 becomes shallower when the numerical aperture NA2 is 0.34. It is therefore evident that the numerical aperture NA2 is desirably in the range from 0.35 to 0.365, as shown by the dotted frame in FIG. 14.

R at this time is 0.5 μm, and when obtaining the range of k1 by substituting λ=365 nm and the range of the numerical aperture NA2 from 0.35 to 0.365, into the Rayleigh formula (1), the range from 0.48 to 0.5 is obtained as k1.

Embodiment 9

In order to form the same dense contact hole pattern as in the embodiment 8 on the resist layer 130, the mask shown in FIG. 11A was used as the ATT mask 124 to expose the resist layer 130 under the same condition as in the embodiment 8.

Different from the embodiment 8, in place of varying the numerical aperture NA2 with the coherence factor σ fixed at 0.8, a plurality of experiments were conducted by fixing the numerical aperture NA2 at 0.35 and varying the coherence factor σ.

FIG. 15 shows a simulation result of the relation between the depth of focus of the projection optical system 26 of the exposure apparatus 10 and the coherence factor σ of the projection optical system 26 when the numerical aperture NA2 is fixed at 0.35 in the above-mentioned embodiment 9.

As is clear from FIG. 15, the depth of focus becomes small in an area where the coherence factor σ is smaller than 0.8, and the depth of focus becomes greatly lower than ±1.2 μm when the coherence factor σ becomes lower than 0.60. However, when the coherence factor σ becomes larger than 0.8, the depth of focus becomes substantially constant.

The limit for producing the light source as for the coherence factor σ is, as mentioned above, approximately 0.85. Therefore, evidently, the coherence factor σ is desirably between 0.6 and 0.85, as shown by the dotted frame in FIG. 15.

Embodiment 10

In the resist pattern, in order to form on the resist layer 130 the transmitting light of the ATT mask 124 of a dense contact hole pattern having a plurality of rectangular holes whose one side is 0.5 μm, the mask shown in FIG. 11(A) was used as the ATT mask 124 to expose the resist layer 130 by the exposure apparatus 10 shown in FIG. 1.

The i-ray of 365 nm wavelength and the chemical amplitude type resist agent for i-ray were used, respectively, as the exposure ray and as the resist layer 130.

Actually, a plurality of experiments were conducted by fixing the numerical aperture NA2 of the exposure apparatus 10 at 0.35, and varying the coherence factor σ as well as the distance between centers of holes (pitch between centers). The coherence factor σ was fixed at 0.8 when the pitch between centers of holes was 1 μm, and otherwise, at 0.4.

Figure 16:
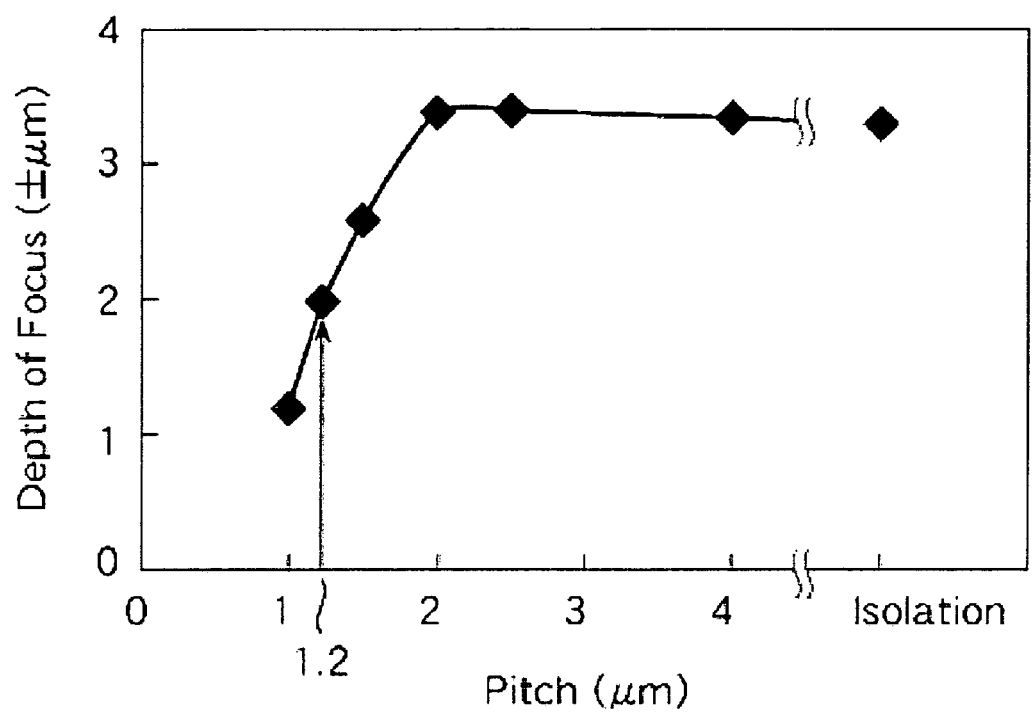
FIG. 16 is a characteristic curve showing a relation between the pitch and the depth of focus of the ATT mask of FIG. 11 when the equal pitch of the light transmitted portion is varied, obtained by a tenth embodiment.

FIG. 16 shows the relation between the pitch between the centers of the holes of the ATT mask 124 and the depth of focus of the projection optical system 26 that resulted from the above embodiment 10.

As is clear from FIG. 16, when the pitch of the light transmitting portion 144 having the same hole width dimension, i.e., the bore diameter of the ATT mask 124 exceeds 1 μm, the depth of focus of the projection optical system 26 rapidly deepens, and the pitch between the centers of the holes becomes substantially constant at the pitch of 2 μm or greater. It is clear that the pitch is desirably 1.2 μm or greater, at which point the depth of focus becomes ±2 μm or greater. In FIG. 16, "isolation" means a case where there exists only a single contact hole.

Embodiment 11

In order to form a dense contact hole pattern having a plurality of rectangular holes having one side as long as 0.5 μm and arranged at a pitch of 2 μm between centers of holes on the resist layer 130, the mask shown in FIG. 11A was used as the ATT mask 124 to expose the resist layer 130 by the exposure apparatus shown in FIG. 1.

An i-ray of 365 nm wavelength and a chemical amplitude type resist for i-ray were used, respectively, as the exposure ray and the resist 130.

Actually, a plurality of experiments were conducted by fixing the coherence factor σ at 0.4 and varying the numerical aperture NA2.

FIG. 17 shows the relation between the pitch between centers of holes and the depth of focus of the projection optical system 26 that resulted from the above embodiment 11.

As is clear from FIG. 17, the depth of focus of the projection optical system 26 becomes the deepest when NA2 is 0.35. FIG. 17 shows by the dotted frame in an area where substantially the same depth of focus is attained when the numerical apertures NA2 are 0.34 and 0.365, respectively.

However, actually, if the lens aberration is taken into consideration, when the numerical aperture NA2 is 0.34, the depth of focus of the projection optical system 26 becomes shallow, so that it is evident that the range of the numerical aperture NA2 is preferably between 0.35 and 0.365. The range of k1 at this time becomes from 0.48 to 0.5, as shown in the embodiment 8.

Embodiment 12

In order to form a dense contact hole pattern having a plurality of rectangular holes with one side as long as 0.5 μm arranged at a pitch of 2 μm between centers of the holes on the resist layer 130, the mask shown in FIG. 11A was used as the ATT mask 124 to expose the resist layer 130 by the exposure apparatus shown in FIG. 1.

An i-ray of 365 nm wavelength and a chemical amplitude resist agent for i-ray were used, respectively, as the exposure ray and as the resist layer 130.

Actually, a plurality of experiments were conducted by fixing the numerical aperture NA2 at 0.35 and varying the coherence factor σ.

Figure 18:
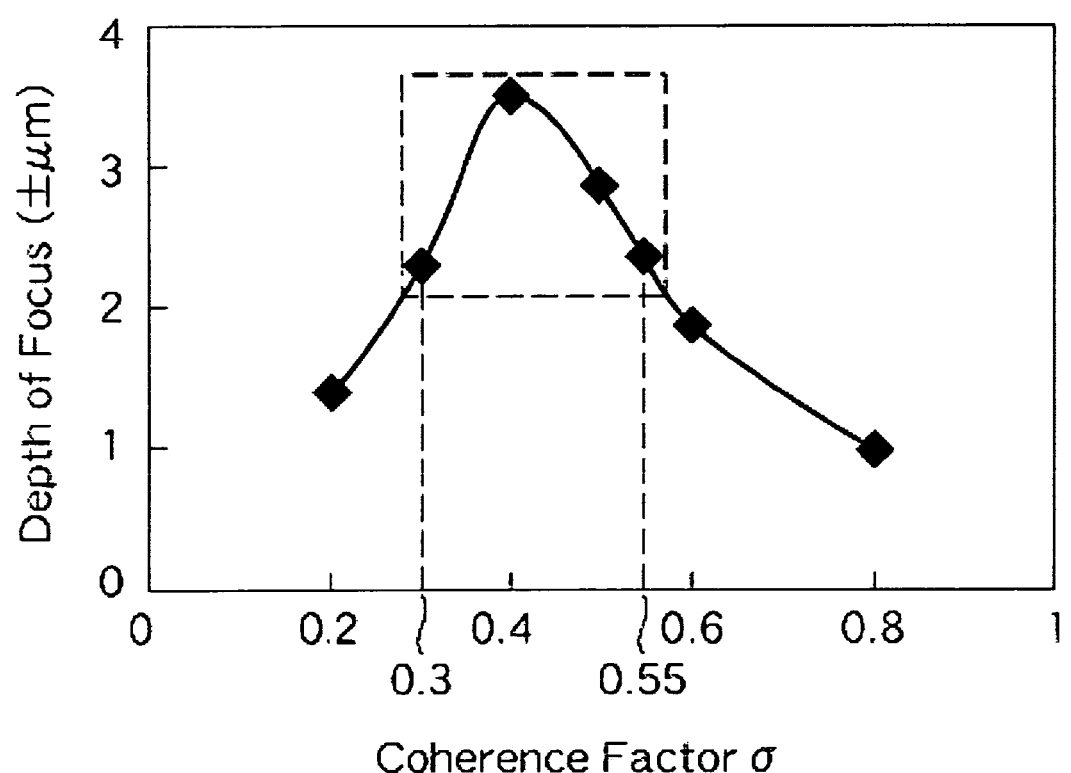
FIG. 18 is a characteristic curve showing a relation between the coherence factor and the depth of focus of a projection optical system of equal magnification of the exposure apparatus in FIG. 1, obtained by a twelfth embodiment.

FIG. 18 shows the relation between the coherence factor σ and the depth of focus of the projection optical system 26 that resulted from the above embodiment 12.

As is clear from FIG. 18, there is a tendency that the depth of focus becomes maximum at the coherence factor σ of 0.4. Also, it is evident that the coherence factor σ is desirably between 0.3 and 0.55, in which range the depth of focus becomes ±2 μm or greater.

In the foregoing exposure method of the present invention, for instance, when a line pattern mask according to the present invention is used in production of a liquid crystal display (LCD), produced parts of a dimension and a shape substantially corresponding to the line pattern of the mask pattern are formed in the LCD. Also, the value of the numerical aperture NA2 and the light source can be specified by each exposure apparatus.

It will be obvious to those having skill in the art that many changes may be made to the details of the above-described embodiments without departing from the underlying principles of the invention. The scope of the present invention should, therefore, be determined only by the following claims.

The invention claimed is:

1. A method of producing a thin film transistor, comprising:
    a step of forming contact holes on a photosensitive material film provided on a glass base plate after irradiating said photosensitive material film with a ray through a mask and then developing said photosensitive material film;
    wherein said ray is an i-ray;
    wherein said mask pattern for exposing contact holes of said mask is a contact hole pattern including either one of a rectangular light transmitting area and a light screening area; and
    wherein said rectangular pattern is a pattern having long and short sides with length dimensions, the length dimension in the direction of the long sides being longer than or equal to 1.4 times the length dimension in the direction of the short sides.

2. The method of claim 1, wherein the contact holes formed in said photosensitive material film have a rectangular planar shape with at least each corner arc-shaped.

3. A method of producing a thin film transistor comprising a step of making a ray from a light source enter an optical system through a mask, and irradiating a photosensitive material film provided on the surface of a glass base plate with a ray having passed said optical system to expose said photosensitive film, wherein said ray is an i-ray;
wherein said mask is a light-screening chrome mask, and a mask pattern formed by said chrome mask for forming contact holes of the thin film transistor formed on said glass plate is either one of a rectangular light transmitting area and a light screening area; and
wherein said optical system is a projection optical system of equal magnification and has the numerical aperture NA which is obtained by the following formula when k1 is a factor having a value between 0.40 and 0.43 and R is the length dimension in the direction of the short sides of said rectangle:

$$NA2=k1\times 0.365/R.$$

4. A method of producing a thin film transistor comprising a step of making a ray from a light source enter an optical system through a mask, irradiating a photosensitive material film provided on a glass base plate with a ray having passed said optical system to expose said photosensitive film,
wherein said ray is an i-ray;
wherein said mask is an attenuated type mask, and the mask pattern of said attenuated type mask is either one of a rectangular light transmitting area and a light screening area; and
wherein said optical system is a projection optical system of equal magnification and has the numerical aperture NA which is obtained by the following formula when k1 is a factor having a value between 0.34 and 0.41 and R is the length dimension in the direction of the short sides of said rectangle:

$$NA2=k1\times 0.365/R.$$

5. The method of claim 1, wherein in said mask pattern for forming said contact holes either one of said light transmitting area and said light screening area is disposed by a periodical pattern in which a pitch in the direction of the long sides of said rectangle is as long as or longer than the sum of the length dimension of a long side and the length dimension of a short side of said rectangle, and a pitch in the direction of the short sides of said rectangle is triple as long as or longer than the length dimension of the short side of said rectangle.

6. The method of claim 3, wherein in said mask pattern for forming said contact holes either one of said light transmitting area and said light screening area is disposed in a periodical pattern in which a pitch in the direction of the long sides of said rectangle is as long as or longer than the sum of the length dimension of a long side and the length dimension of a short side of said rectangle, and a pitch in the direction of the short sides of said rectangle is triple as long as or longer than the length dimension of the short side of said rectangle.

7. The method of claim 4, wherein in said mask pattern for forming said contact holes either one of said light transmitting area and said light screening area is disposed by a periodical pattern in which a pitch in the direction of the long sides of said rectangle is equal to or greater than the sum of the length dimension of a long side and the length dimension of a short side of said rectangle, and a pitch in the direction of the short sides of said rectangle is triple as long as or longer than the length dimension of the short side of said rectangle.

8. The method of claim 1, wherein said contact holes to be formed in correspondence to said mask pattern on a resist film formed by a development after exposure on said photosensitive material film have at least a rectangular planar shape with at least each corner arc-shaped.

9. The method of claim 3, wherein said contact holes to be formed in correspondence to said mask pattern on a resist film formed by a development after exposure on said photosensitive material film have at least a rectangular planar shape with at least each corner are-shaped.

10. The method of claim 4, wherein said contact holes to be formed in correspondence to said mask pattern on a resist film formed by a development after exposure on said photosensitive material film have at least a rectangular planar shape with at least each corner arc-shaped.

11. A method of selectively exposing a photosensitive material layer formed on said semiconductor film through a mask in order to form contact holes of an electrical circuit provided on a semiconductor thin film crystallized on a glass base plate, wherein the pattern of said mask is rectangular and the length dimension in the direction of the long sides of said rectangular shape is 1.4 as long as or longer than the length dimension in the direction of its short sides.

12. A method of exposing using an attenuated type phase shift mask, wherein a ray from a light source for exposure is made to enter an optical system through an attenuated type mask and to irradiate a resist layer made of a photosensitive material on a glass base plate with a ray from said light source for exposure;
wherein said ray is an i-ray;
wherein said attenuated type mask has a line pattern; and
wherein said optical system is a projection optical system of equal magnification and has the numerical aperture NA which is obtained from the following formula when k1 is a factor having a value between 0.41 and 0.44 and R is the width of lines to be formed on said resist layer:

$$NA2=k1\times 0.365/R.$$

13. A method of exposing using an attenuated type phase shift mask claimed in claim 12, wherein the coherence factor σ of said i-ray ranges from 0.75 to 0.85.

14. A method of exposing using an attenuated type phase shift mask, wherein a ray from a light source for exposure is made to enter an optical system through an attenuated type mask and to irradiate a resist layer made of a photosensitive material on a glass base plate with a ray from said light source for exposure;
wherein said ray is an i-ray;
wherein said attenuated type mask has a contact hole pattern; and
wherein said optical system is a projection optical system of equal magnification, and has the numerical aperture NA which is obtained by the following formula when k1 is a factor having a value from 0.48 to 0.5 and R is the diameter of the holes to be formed on said resist:

$$NA2=k1\times 0.365/R.$$

15. A method of exposing using an attenuated type phase shift mask claimed in claim 14, wherein the coherence factor σ of said i-ray ranges from 0.6 to 0.8.

16. A method of exposing using an attenuated type phase shift mask, wherein a ray from a light source for exposure is made to enter an optical system through an attenuated type mask and to irradiate a resist layer made of a photosensitive material on a glass base plate with a ray from said light source for exposure;
wherein said ray is an i-ray;
wherein said attenuated type mask has a contact hole pattern to be formed on said resist layer on said glass base plate and having a contact hole arrangement pitch of four times as wide as or wider than the diameter of contact holes; and wherein said optical system has the numerical aperture NA which is obtained by the following equation when k1 is a factor having a value from 0.48 to 0.5 and R is the diameter of contact holes to be formed on said resist layer:

$$NA2 = k1 \times 0.365/R.$$

17. An exposure method using an attenuated type phase shift mask claimed in claim 16, wherein the coherence factor σ of said i-ray ranges from 0.3 to 0.55.

* * * * *